United States Patent
Ha et al.

(10) Patent No.: US 12,074,187 B2
(45) Date of Patent: Aug. 27, 2024

(54) IMAGE SENSOR

(71) Applicant: Samsung Electronics Co., Ltd., Suwon-si (KR)

(72) Inventors: Hyoun-Jee Ha, Hwaseong-si (KR); Seungwook Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 517 days.

(21) Appl. No.: 17/371,424

(22) Filed: Jul. 9, 2021

(65) Prior Publication Data

US 2022/0068982 A1   Mar. 3, 2022

(30) Foreign Application Priority Data

Sep. 2, 2020 (KR) ........................ 10-2020-0111605

(51) Int. Cl.
*H01L 27/146* (2006.01)
*H01L 27/148* (2006.01)

(52) U.S. Cl.
CPC .... *H01L 27/1463* (2013.01); *H01L 27/14603* (2013.01); *H01L 27/14621* (2013.01); *H01L 27/14627* (2013.01); *H01L 27/14636* (2013.01); *H01L 27/14831* (2013.01)

(58) Field of Classification Search
CPC .................................................. H01L 27/1463
See application file for complete search history.

(56) References Cited

U.S. PATENT DOCUMENTS

| | | |
|---|---|---|
| 7,342,211 B2 | 3/2008 | Park et al. |
| 8,946,794 B2 | 2/2015 | Ahn |
| 9,054,003 B2 | 6/2015 | Ahn et al. |
| 9,281,331 B2 | 3/2016 | Chen et al. |
| 9,508,771 B2 | 11/2016 | Lee et al. |
| 9,647,016 B2 | 5/2017 | Oh et al. |
| 9,780,142 B1 | 10/2017 | Koo et al. |
| 9,865,704 B2 | 1/2018 | Xie et al. |
| 9,887,219 B2 | 2/2018 | Sano et al. |
| 10,192,910 B2 | 1/2019 | Ihara |
| 2018/0190692 A1 | 7/2018 | Choi et al. |
| 2021/0143191 A1 | 5/2021 | Ha et al. |

*Primary Examiner* — David A Zarneke
(74) *Attorney, Agent, or Firm* — Muir Patent Law, PLLC

(57) ABSTRACT

An image sensor includes a substrate having a first surface and a second surface, which are opposite to each other, the substrate including a unit pixel region including a device isolation pattern adjacent to the first surface and a photoelectric conversion region adjacent to the second surface, a pixel isolation pattern provided in the substrate to define the unit pixel regions, an impurity region in the unit pixel region and being adjacent to a side surface of the device isolation pattern, a gate electrode provided on the first surface, and an auxiliary isolation pattern provided between a first side surface of the gate electrode and the impurity region, when the image sensor is viewed in a plan view. A bottom surface of the auxiliary isolation pattern may be located at a level different from a bottom surface of the device isolation pattern.

20 Claims, 33 Drawing Sheets

IMAGE SENSOR

CROSS-REFERENCE TO RELATED APPLICATIONS

This U.S. non-provisional patent application claims priority under 35 U.S.C. § 119 to Korean Patent Application No. 10-2020-0111605, filed on Sep. 2, 2020, in the Korean Intellectual Property Office, the entire contents of which are hereby incorporated by reference.

BACKGROUND OF THE INVENTION

The present invention relates to an image sensor, and in particular, to an image sensor including an auxiliary isolation pattern.

An image sensor is a device converting an optical image to electrical signals. The image sensor is classified into two types: a charge coupled device (CCD) type and a complementary metal-oxide-semiconductor (CMOS) type. The CMOS-type image sensor is called CIS for short. The CIS includes a plurality of unit pixel regions which are two-dimensionally arranged. Each of the unit pixel regions includes a photodiode, which is used to convert an incident light to an electric signal.

SUMMARY

An embodiment of the inventive concept provides an image sensor that has a unit pixel region configuration which increase the freedom of designing and fabricating the image sensor.

According to an embodiment of the inventive concept, an image sensor may include a substrate having a first surface and a second surface, which are opposite to each other, the substrate including a unit pixel region including a device isolation pattern adjacent to the first surface and a photoelectric conversion region adjacent to the second surface, a pixel isolation pattern provided in the substrate to define the unit pixel region, an impurity region provided in the unit pixel region and being adjacent to a side surface of the device isolation pattern, a gate electrode provided on the first surface, and an auxiliary isolation pattern provided between a first side surface of the gate electrode and the impurity region, when the image sensor is viewed in a plan view. A bottom surface of the auxiliary isolation pattern may be located at a level different from a bottom surface of the device isolation pattern.

According to an embodiment of the inventive concept, an image sensor may include a substrate having a first surface and a second surface, which are opposite to each other, and including a unit pixel region including a floating diffusion region adjacent to the first surface, and a photoelectric conversion region adjacent to the second surface, a device isolation pattern provided in an upper portion of the substrate and extending from the first surface toward the second surface, a pixel isolation pattern penetrating the substrate and the device isolation pattern and defining the unit pixel region, an impurity region provided in the unit pixel region and adjacent to a side surface of the device isolation pattern, and a first auxiliary isolation pattern provided between the impurity region and the floating diffusion region and extended in a first direction, when the image sensor is viewed in a plan view. The unit pixel region may include a first active pattern and a second active pattern, which are provided in the upper portion of the substrate and are spaced apart from each other in the first direction. The smallest width of the device isolation pattern between the first and second active patterns at a level of the first surface may be larger than a width of the auxiliary isolation pattern at the level of the first surface.

According to an embodiment of the inventive concept, an image sensor may include a substrate having a first surface and a second surface, which are opposite to each other, the substrate including a pixel array region, an optical black region, and a pad region, the pixel array region including a plurality of unit pixel regions, a pixel isolation pattern provided in the substrate to define the plurality of unit pixel regions, the pixel isolation pattern including an isolation filler pattern and an isolation liner interposed between the isolation filler pattern and the substrate, a photoelectric conversion region provided in each of the plurality of unit pixel regions and adjacent to the second surface, an impurity region and a floating diffusion region provided in each of the plurality of unit pixel regions and adjacent to the first surface, a device isolation pattern provided at a side surface of the impurity region and a side surface of the floating diffusion region, a gate electrode on the first surface of the substrate, a gate dielectric layer interposed between the gate electrode and the substrate, a gate spacer provided on top and side surfaces of the gate electrode, an interconnection layer provided on the first surface of the substrate, the interconnection layer including an insulating layer and a plurality of interconnection lines in the insulating layer, an auxiliary isolation pattern provided in the substrate and between the gate electrode and the impurity region and extended in a first direction, when the image sensor is viewed in a plan view, an anti-reflection layer provided on the second surface of the substrate, a back-side insulating layer on a bottom surface of the anti-reflection layer, a color filter on a bottom surface of the back-side insulating layer, and a micro lens on a bottom surface of the color filter. A bottom surface of the auxiliary isolation pattern may be located at a level different from a bottom surface of the device isolation pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
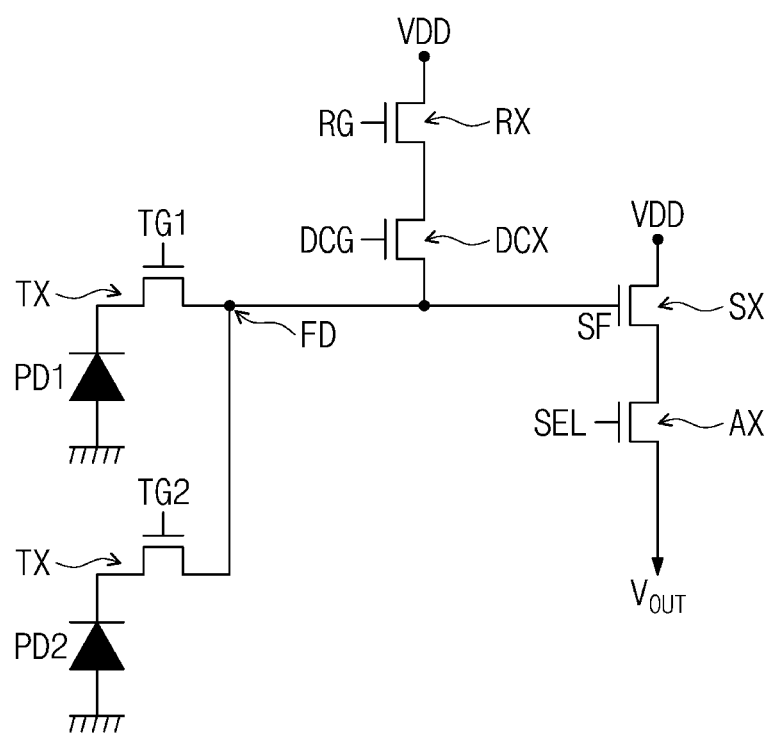
FIG. 1 is a circuit diagram illustrating an image sensor according to an embodiment of the inventive concept.

FIG. 1 is a circuit diagram illustrating an image sensor according to an embodiment of the inventive concept.

Referring to FIG. 1, an image sensor may include unit pixel regions, in which photoelectric conversion regions PD1 and PD2, a transfer transistor TX, a source follower transistor SX, a reset transistor RX, a dual conversion transistor DCX, and a selection transistor AX are provided. The transfer transistor TX, the source follower transistor SX, the reset transistor RX, the dual conversion transistor DCX, and the selection transistor AX may include a transfer gate TG, a source follower gate SF, a reset gate RG, a dual conversion gate DCG, and a selection gate SEL, respectively.

Each of the photoelectric conversion regions PD1 and PD2 may be a photodiode including an n-type impurity region and a p-type impurity region. A floating diffusion region FD may serve as a common drain of the transfer transistors TX. The floating diffusion region FD may serve as a source of the dual conversion transistor DCX. The floating diffusion region FD may be electrically connected to the source follower gate SF of the source follower transistor SX. The source follower transistor SX may be connected to the selection transistor AX.

Hereinafter, an operation of the image sensor will be described with reference to FIG. 1. First, a power voltage VDD may be applied to a drain of the reset transistor RX and a drain of the source follower transistor SX in a light-blocking state, and then the reset transistor RX and the dual conversion transistor DCX may be turned on to discharge electric charges from the floating diffusion region FD. Thereafter, electron-hole pairs may be produced in the photoelectric conversion regions PD1 and PD2 by turning the reset transistor RX off and entering an external light into the photoelectric conversion regions PD1 and PD2. Holes generated, in response to the external light, from a depletion region of each of the photoelectric conversion regions PD1 and PD2 may be moved to a region (e.g., a first impurity region 160 of FIG. 5A) which is grounded, and electrons generated, in response to the external light, from the depletion region may be moved to and accumulated in an n-type impurity region of each of the photoelectric conversion regions PD1 and PD2. If the transfer transistors TX is turned on, the accumulated electrons may be transferred to the floating diffusion region FD. A change in the accumulated charge amount may lead to a change in gate bias of the source follower transistor SX and consequently a change in source potential of the source follower transistor SX. When the selection transistor AX is turned on, an amount of the electric charges may be read out as a signal (i.e., an output signal of the image sensor) to be transmitted through a column line, which will be described below.

An interconnection line may be electrically connected to at least one of the transfer gate TG, the source follower gate SF, the dual conversion gate DCG, the reset gate RG and the selection gate SEL. The interconnection line may apply the power voltage VDD to the drain of the reset transistor RX or the drain of the source follower transistor SX. The interconnection line may include the column line connected to the selection transistor AX. The interconnection line may be interconnection lines, which will be described below.

FIG. 1 illustrates an example, in which a single floating diffusion region FD is electrically shared by the photoelectric conversion regions PD1 and PD2, but the inventive concept is not limited to this example. For example, one unit pixel region may include one of the photoelectric conversion regions PD1 and PD2, the floating diffusion region FD, and five transistors TX, DCX, RX, AX, and SX, and here, the reset, dual conversion, source follower, and selection transistors RX, DCX, SX, and AX may be shared by neighboring unit pixel regions. The number of the photoelectric conversion regions PD1 and PD2 sharing one floating diffusion region FD is not limited to this example. Accordingly, an integration density of the image sensor may be increased.

Figure 2:
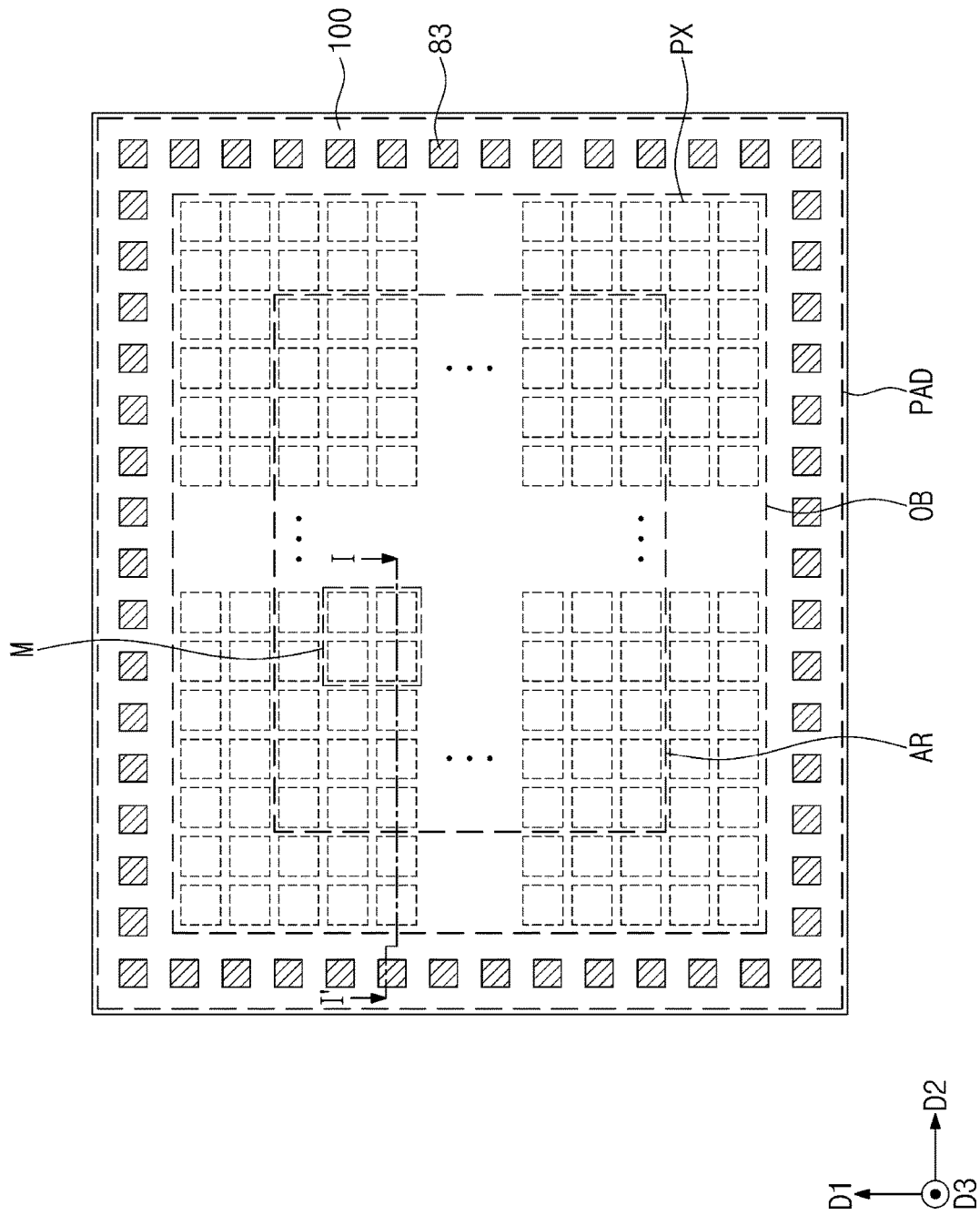
FIG. 2 is a plan view illustrating an image sensor according to an embodiment of the inventive concept.
Figure 3:
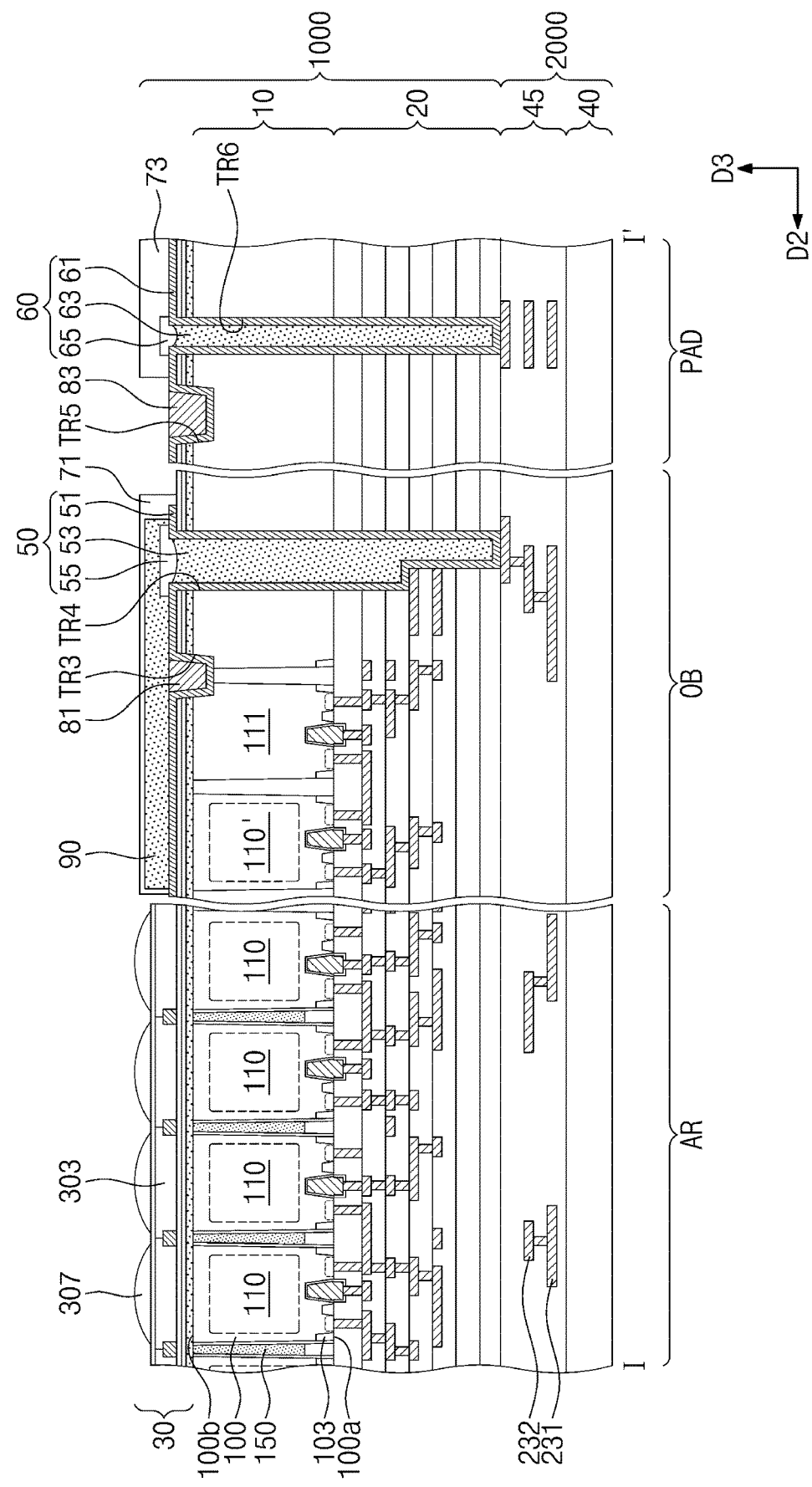
FIG. 3 is a sectional view taken along a line I-I' of FIG. 2.

FIG. 2 is a plan view illustrating an image sensor according to an embodiment of the inventive concept. FIG. 3 is a sectional view taken along a line I-I' of FIG. 2.

Referring to FIGS. 2 and 3, an image sensor may include a sensor chip 1000 and a logic chip 2000. The sensor chip 1000 may include a photoelectric conversion layer 10, a first interconnection layer 20, and an optically-transparent layer 30. The photoelectric conversion layer 10 may include a first substrate 100, a pixel isolation pattern 150, a device isolation pattern 103, and a photoelectric conversion region 110 provided in the first substrate 100. The photoelectric conversion region 110 may convert light, which is incident from the outside, to electrical signals.

The first substrate 100 may include a pixel array region AR, an optical black region OB, and a pad region PAD, when the image sensor is viewed in a plan view. The pixel array region AR may be disposed in a center region of the first substrate 100 in the plan view. The pixel array region AR may include a plurality of unit pixel regions PX. The unit pixel regions PX may produce and output a photoelectric signal from the incident light. The unit pixel regions PX may be two-dimensionally arranged to form a plurality of columns and a plurality of rows. The columns may be parallel to a first direction D1. The rows may be parallel to a second direction D2. In the present specification, the first direction D1 may be parallel to a first surface 100a of the first substrate 100. The second direction D2 may be also parallel to the first surface 100a of the first substrate 100 and may cross the first direction D1. A third direction D3 may be substantially perpendicular to the first surface 100a of the first substrate 100.

The pad region PAD may be provided in an edge region of the first substrate 100 to enclose the pixel array region AR in the plan view. Second pad terminals 83 may be provided in the pad region PAD. The second pad terminals 83 may be used to output electrical signals, which are produced in the unit pixel regions PX, to the outside. In addition, an external signal or voltage may be provided to the unit pixel regions PX through the second pad terminals 83. Since the pad region PAD is provided in the edge region of the first substrate 100, the second pad terminals 83 may be easily coupled to the outside.

The optical black region OB may be disposed between the pixel array region AR and the pad region PAD of the first substrate 100. The optical black region OB may enclose the pixel array region AR in the plan view. The optical black region OB may include a plurality of dummy regions 111. A signal produced in the dummy region 111 may be used as information for removing a process noise. Hereinafter, the pixel array region AR of the image sensor will be described in more detail with reference to FIGS. 4 to 5D.

Figure 4:
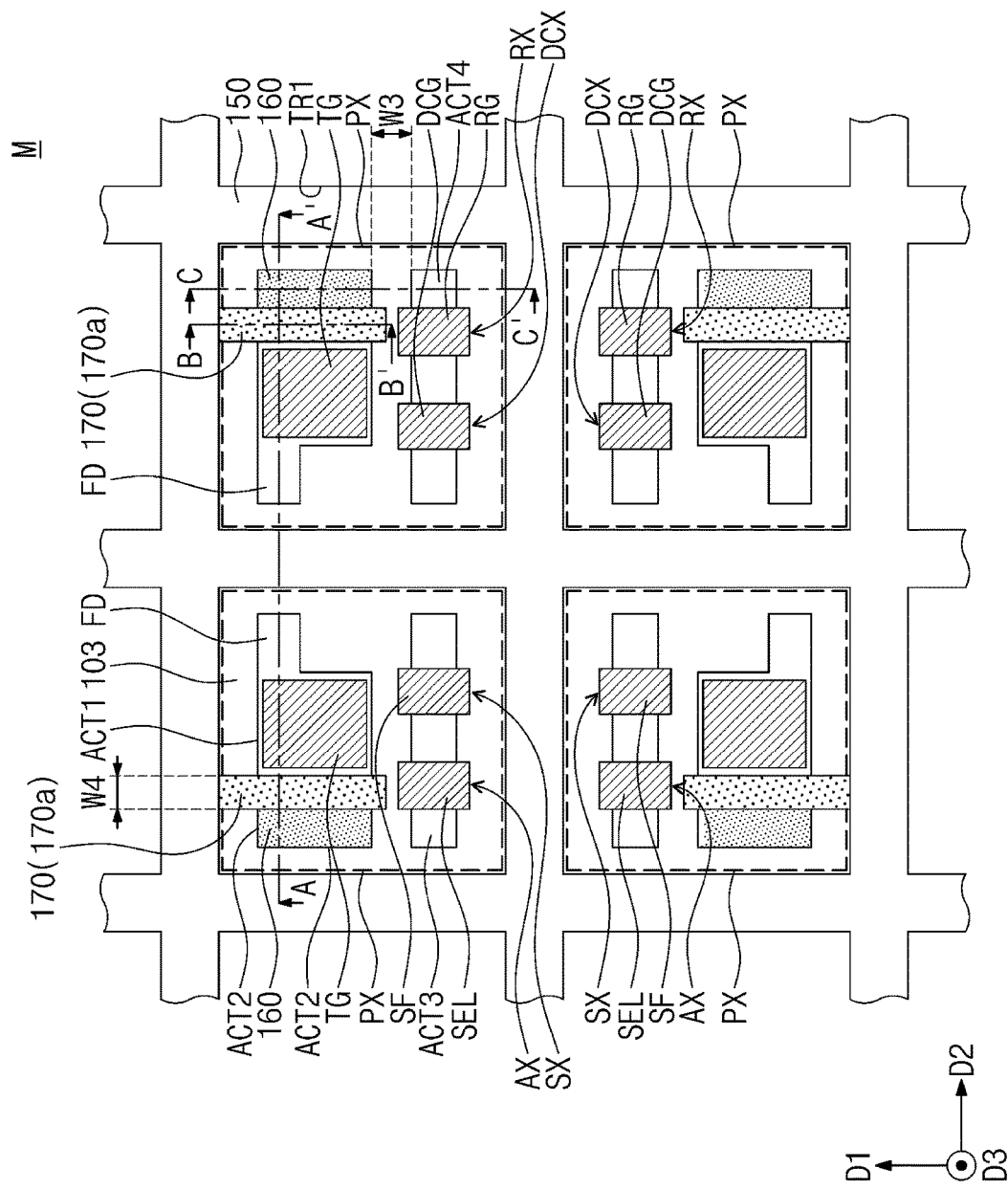
FIG. 4 is an enlarged plan view illustrating a portion M of FIG. 2.
Figure 5A:
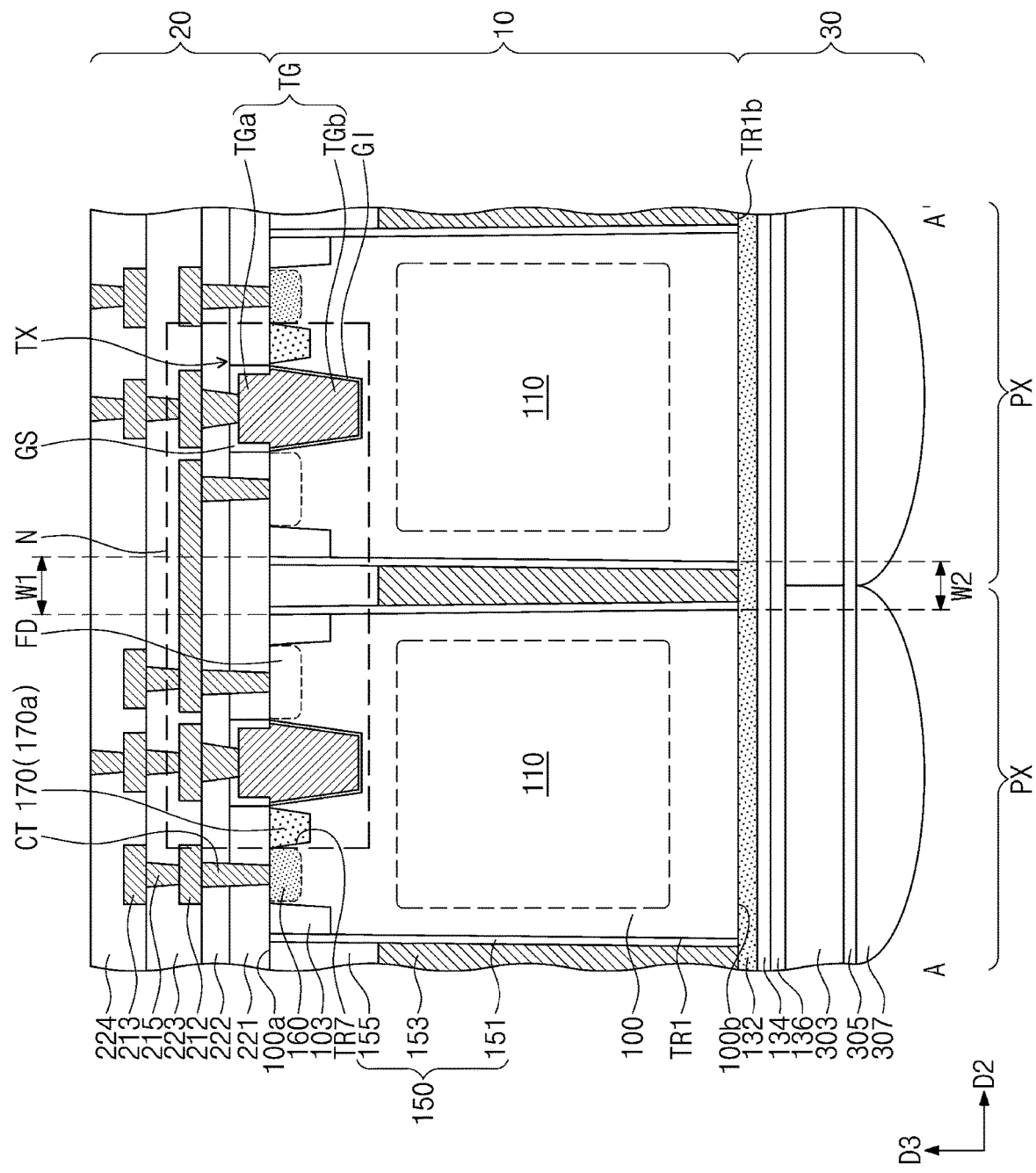
FIGS. 5A to 5C are sectional views taken along lines A-A', B-B', and C-C' of FIG. 4.
Figure 5B:
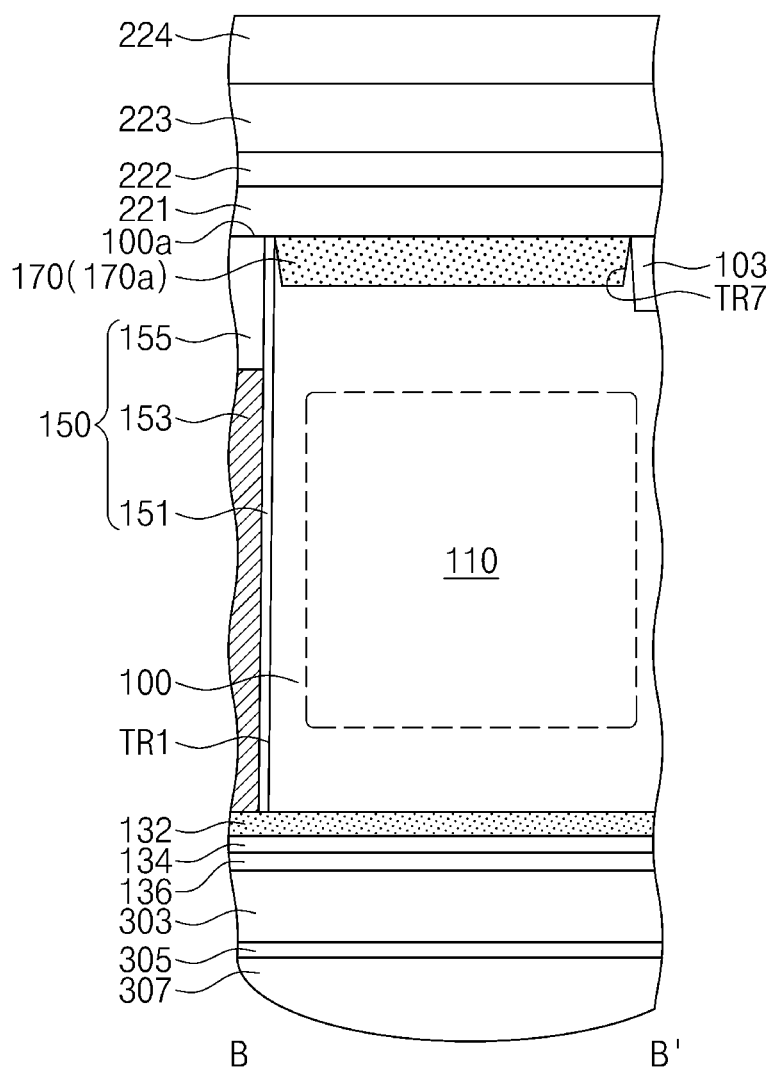
Figure 5B:
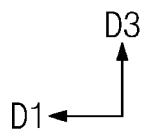
Figure 5C:
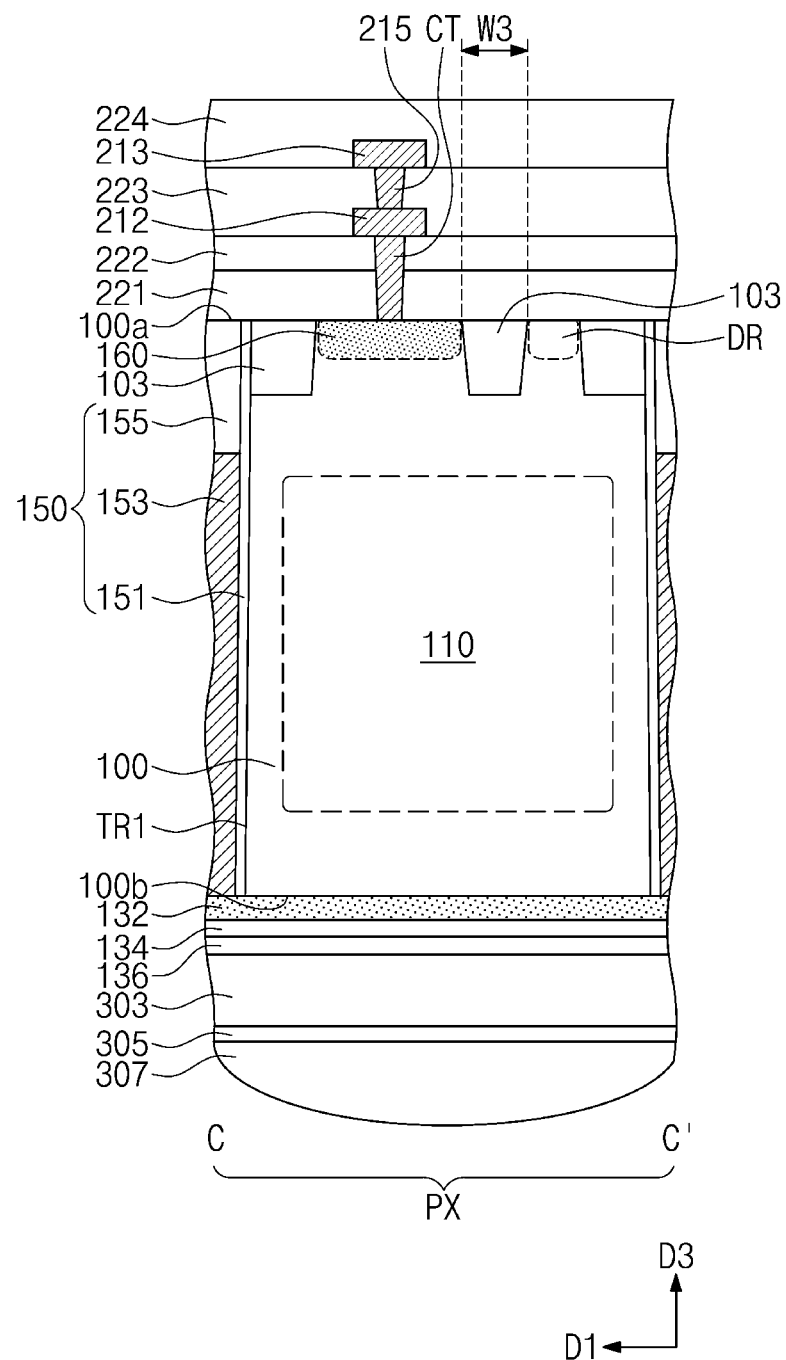
Figure 5D:
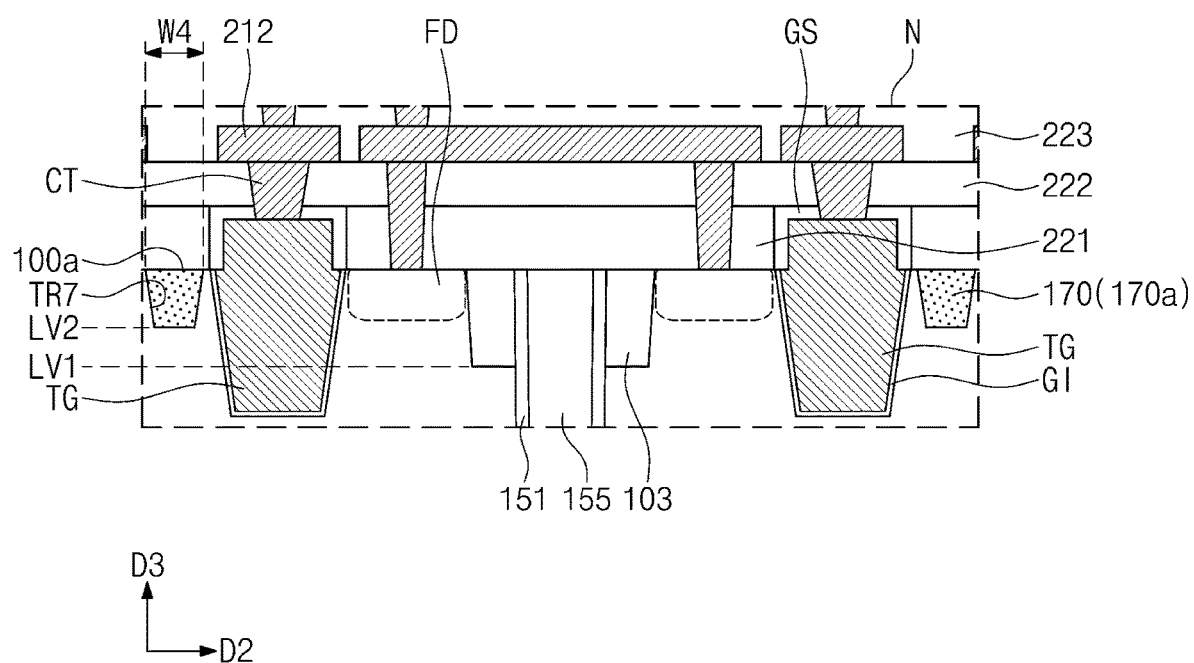
FIG. 5D is an enlarged sectional view illustrating a portion N of FIG. 5A.

FIG. 4 is an enlarged plan view illustrating a portion M of FIG. 2. FIGS. 5A to 5C are sectional views taken along lines A-A', B-B', and C-C' of FIG. 4. FIG. 5D is an enlarged sectional view illustrating a portion N of FIG. 5A.

Referring to FIGS. 4 and 5A to 5C, an image sensor may include the photoelectric conversion layer 10, the gate electrodes TG, RG, DCG, SEL, and SF, the first interconnection layer 20, and the optically-transparent layer 30. The photoelectric conversion layer 10 may include the first substrate 100, the pixel isolation pattern 150, and the device isolation pattern 103.

The first substrate 100 may have a first surface 100a and a second surface 100b that are opposite to each other. Light may be incident into the second surface 100b of the first substrate 100. The first interconnection layer 20 may be disposed on the first surface 100a of the first substrate 100, and the optically-transparent layer 30 may be disposed on the second surface 100b of the first substrate 100. The first substrate 100 may be a semiconductor substrate or a silicon-on-insulator (SOI) substrate. The semiconductor substrate may include, for example, a silicon substrate, a germanium substrate, or a silicon-germanium substrate. The first substrate 100 may be doped with impurities of a first conductivity type. For example, the impurities of the first conductivity type may include p-type impurities, such as aluminum (Al), boron (B), indium (In) and/or gallium (Ga).

The first substrate 100 may include the unit pixel regions PX defined by the pixel isolation pattern 150. When the image sensor is viewed in a plan view, each of the unit pixel regions PX may be enclosed with the pixel isolation pattern 150. The unit pixel regions PX may be arranged in two different directions (e.g., the first and second directions D1 and D2) to form a matrix-shaped arrangement. The first substrate 100 may include the photoelectric conversion regions 110. The photoelectric conversion regions 110 may be respectively provided in the unit pixel regions PX of the first substrate 100. The photoelectric conversion regions 110 may have the same function as the photoelectric conversion regions PD1 and PD2 of FIG. 1. Each of the photoelectric conversion regions 110 may be a region of the first substrate 100 that is doped with impurities of the second conductivity type. The second conductivity type may be different from the first conductivity type. The impurities of the second conductivity type may include n-type impurities (e.g., phosphorus, arsenic, bismuth, and/or antimony). For example, the photoelectric conversion regions 110 may be adjacent to the second surface 100b of the first substrate 100. The photoelectric conversion regions 110 may be closer to the second surface 100b than to the first surface 100a. As another example, the photoelectric conversion regions 110 may be adjacent to the first surface 100a of the first substrate 100. The photoelectric conversion regions 110 may be closer to the first surface 100a than to the second surface 100b. For example, each of the photoelectric conversion regions 110 may include a first region and a second region, which are provided adjacent to the first surface 100a and the second surface 100b, respectively. There may be a difference in impurity concentration between the first and second regions of the photoelectric conversion region 110. In this case, the photoelectric conversion region 110 may have a non-vanishing potential gradient between the first and second surfaces 100a and 100b of the first substrate 100. As another example, the photoelectric conversion region 110 may have a vanishing potential gradient between the first and second surfaces 100a and 100b of the first substrate 100.

The first substrate 100 and the photoelectric conversion region 110 may constitute a photodiode. For example, the first substrate 100 of the first conductivity type and the photoelectric conversion region 110 of the second conductivity type may form a pn junction serving as the photodiode. An amount of photocharges, which are produced and accumulated in the photoelectric conversion region 110 in the photodiode, may be proportional to an intensity of an incident light.

Referring to FIG. 4, the pixel isolation pattern 150 may be provided in the first substrate 100 to define the unit pixel regions PX. For example, the pixel isolation pattern 150 may be provided between the unit pixel regions PX of the first substrate 100. When viewed in a plan view, the pixel isolation pattern 150 may have a lattice or grid structure. When viewed in a plan view, the pixel isolation pattern 150 may be provided to completely enclose each of the unit pixel regions PX. The pixel isolation pattern 150 may be provided in a first trench TR1. The first trench TR1 may be recessed from the first surface 100a of the first substrate 100. In an embodiment, the first trench TR1 extends from the first surface 100a of the first substrate 100 to the second surface 100b thereof. The pixel isolation pattern 150 may be extended from the first surface 100a of the first substrate 100 toward the second surface 100b. In an embodiment, the pixel isolation pattern 150 fills the first trench TR1, and extends from the first surface 100a of the first substrate 100 to the second surface 100b thereof. The pixel isolation pattern 150 may be a deep trench isolation layer. The pixel isolation pattern 150 may be provided to penetrate the first substrate 100. A vertical height of the pixel isolation pattern 150 may be substantially equal to a vertical thickness of the first substrate 100. In an embodiment, a width of the pixel isolation pattern 150 may gradually decrease from the first surface 100a of the first substrate 100 toward the second surface 100b. A width of the pixel isolation pattern 150 at the level of the first surface 100a may be a first width W1, and a width of the pixel isolation pattern 150 at the level of the second surface 100b may be a second width W2. The first width W1 may be larger than the second width W2.

The pixel isolation pattern 150 may include a first isolation pattern 151 (i.e., an isolation liner), a second isolation pattern 153 (i.e., a filler isolation pattern), and a capping pattern 155. The first isolation pattern 151 may be provided along a side surface of the first trench TR1. The first isolation pattern 151 may be formed of or include at least one of, for example, silicon-based insulating materials (e.g., silicon nitride, silicon oxide, and/or silicon oxynitride) and/or high-k dielectric materials (e.g., hafnium oxide and/or aluminum oxide). In an embodiment, the first isolation pattern 151 may include a plurality of layers formed of different materials. The first isolation pattern 151 may have a lower refractive index than the first substrate 100. In this case, it may be possible to prevent or suppress a cross-talk issue among incoming light from occurring between the unit pixel regions PX of the first substrate 100.

The second isolation pattern 153 may be provided in an inside region of the first trench TR1 defined with the first isolation pattern 151. For example, a side surface of the second isolation pattern 153 may be surrounded by the first isolation pattern 151. The first isolation pattern 151 may be interposed between the second isolation pattern 153 and the first substrate 100. The second isolation pattern 153 may be spaced apart from the first substrate 100 by the first isolation pattern 151. Thus, during an operation of the image sensor, the second isolation pattern 153 may be electrically separated from the first substrate 100. The second isolation pattern 153 may be formed of or include a crystalline semiconductor material (e.g., polycrystalline silicon). In an embodiment, the second isolation pattern 153 may be doped with dopants of a first or second conductivity type. For example, the second isolation pattern 153 may be formed of or include doped polycrystalline silicon. In another embodiment, the second isolation pattern 153 may be formed of or include an undoped polycrystalline semiconductor material. For example, the second isolation pattern 153 may be formed of or include undoped polycrystalline silicon. Here, the term "undoped" may mean that a doping process is intentionally omitted. The dopants may include n-type dopants and p-type dopants.

The capping pattern 155 may be provided on a top surface of the second isolation pattern 153. The capping pattern 155 may be adjacent to the first surface 100a of the first substrate 100. A top surface of the capping pattern 155 may be coplanar with the first surface 100a of the first substrate 100. A bottom surface of the capping pattern 155 may be in contact with the top surface of the second isolation pattern 153. The capping pattern 155 may be formed of or include a non-conductive material. For example, the capping pattern 155 may be formed of or include at least one of silicon-based insulating materials (e.g., silicon nitride, silicon oxide, and/or silicon oxynitride) and/or high-k dielectric materials (e.g., hafnium oxide and/or aluminum oxide). The pixel isolation pattern 150 may prevent photocharges, which are produced by light incident into each of the unit pixel regions PX, from entering neighboring ones of the unit pixel regions PX through a random drift phenomenon, thereby preventing a cross-talk issue between the unit pixel regions PX.

The device isolation pattern 103 may be provided in the first substrate 100. For example, the device isolation pattern 103 may be provided in a second trench TR2. The second trench TR2 may be recessed from the first surface 100a of the first substrate 100. The device isolation pattern 103 may be a shallow trench isolation (STI) layer. The device isolation pattern 103 and an auxiliary isolation pattern may define first active patterns ACT1, second active patterns ACT2, third active patterns ACT3, and fourth active patterns ACT4. A bottom surface of the device isolation pattern 103 may be provided in the first substrate 100. A width of the device isolation pattern 103 may gradually decrease from the first surface 100a of the first substrate 100 toward the second surface 100b. The bottom surface of the device isolation pattern 103 may be vertically spaced apart from the photoelectric conversion regions 110. The pixel isolation pattern 150 may be overlapped with a portion of the device isolation pattern 103. At least a portion of the device isolation pattern 103 may be disposed on an upper side surface of the pixel isolation pattern 150 and may be in contact with the upper side surface of the pixel isolation pattern 150. The side and bottom surfaces of the device isolation pattern 103 and the side surface of the pixel isolation pattern 150 may be provided to form a stepwise structure. A depth of the device isolation pattern 103 may be smaller than a depth of the pixel isolation pattern 150. For example, the depth of the device isolation pattern 103 may have a value between from 2,500 Å to 3,000 Å. The device isolation pattern 103 may be formed of or include at least one of silicon-containing insulating materials. For example, the device isolation pattern 103 may be formed of or include at least one of silicon nitride, silicon oxide, and/or silicon oxynitride. As another example, the device isolation pattern 103 may include a plurality of layers, which are formed of or include different materials from each other.

Each of the unit pixel regions PX may include the first active pattern ACT1 defined by the device isolation pattern 103. The first active pattern ACT1 may have a 'L' shape, when viewed in a plan view. Each of the unit pixel regions PX may include the second active pattern ACT2. The second active patterns ACT2 may be line-shaped patterns extending in the first direction D1. Each of the unit pixel regions PX may include the third active pattern ACT3 or the fourth active pattern ACT4. The third active pattern ACT3 and the fourth active pattern ACT4 may be defined by the device isolation pattern 103. When viewed in a plan view, each of the third and fourth active patterns ACT3 and ACT4 may be disposed in an edge region of the unit pixel region PX. Each of the third and fourth active patterns ACT3 and ACT4 may be line-shaped patterns extending in the second direction D2. However, the planar shapes of the first to fourth active patterns ACT1, ACT2, ACT3, and ACT4 are not limited to the shapes shown in FIG. 4 and may be variously changed.

The transfer transistor TX, the source follower transistor SX, the reset transistor RX, the dual conversion transistor DCX and the selection transistor AX previously described with reference to FIG. 1 may be provided on the first surface 100a of the first substrate 100. The transfer transistor TX may be provided on the first active pattern ACT1 of each of the unit pixel regions PX. The transfer transistor TX may be electrically connected to the photoelectric conversion region 110. The transfer transistor TX may include the transfer gate TG on the first active pattern ACT1 and the floating diffusion region FD. For example, the transfer transistor TX may selectively transfer photo charges (e.g., electrons) of the photoelectric conversion region 110 to the floating diffusion region FD. The transfer gate TG may include a first portion TGa, which is buried in a first insulating layer 221 which is provided on the first surface 100a of the first substrate 100, and a second portion TGb, which is buried in the first substrate 100 and extends from the first portion TGa into the first substrate 100. The largest width of the first portion Tga in the second direction D2 may be smaller than the largest width of the second portion TGb in the second direction D2. A gate dielectric layer GI may be interposed between the transfer gate TG and the first substrate 100. The gate dielectric layer GI may be extended along bottom and side surfaces of the second portion TGb. The floating diffusion region FD may be adjacent to a side surface of the transfer gate TG. The floating diffusion region FD may be provided in the first active pattern ACT1. The floating diffusion region FD may have a second conductivity type (e.g., n-type) that is different from that of the first substrate 100. For example, the floating diffusion region FD may be doped with impurities of the second conductivity type (e.g., n-type dopants or impurities) that are different from the impurities of the first conductivity type doped in the first substrate 100.

The gate electrodes TG, SEL, SF, DCG, and RG may be provided on the first surface 100a of the first substrate 100. The gate electrodes TG, SEL, SF, DCG, and RG may include the transfer gate TG, the selection gate SEL, the source follower gate SF, the dual conversion gate DCG, and the reset gate RG. The source follower transistor SX and the selection transistor AX may be provided on the third active patterns ACT3 of the unit pixel regions PX. The source follower transistor SX may include the source follower gate SF provided on the third active pattern ACT3, and the selection transistor AX may include the selection gate SEL. The reset transistor RX and the dual conversion transistor DCX may be provided on the fourth active patterns ACT4 of the unit pixel regions PX. The reset transistor RX may include the reset gate RG provided on the fourth active pattern ACT4, and the dual conversion transistor DCX may include the dual conversion gate DCG. The gate dielectric layer GI may be interposed between the first substrate 100 and each of the transfer gate TG, the selection gate SEL, the source follower gate SF, the dual conversion gate DCG, and the reset gate RG. A gate spacer GS may be provided on top and side surfaces of each of the gate electrodes TG, SEL, SF, DCG, and RG. The gate spacer GS may be formed of or may include at least one of, for example, silicon nitride, silicon carbonitride, or silicon oxynitride.

Each of the unit pixel regions PX may include a first impurity region 160 provided in the first substrate 100. The first impurity region 160 may be adjacent to the first surface 100a of the first substrate 100. The first impurity region 160 may be provided in an upper portion of the first substrate 100. The first impurity region 160 may be provided in the second active pattern ACT2. The first impurity region 160 may be adjacent to a side surface of the device isolation pattern 103. The device isolation pattern 103 may extend from the first surface 100a of the first substrate 100 toward the second surface 100b thereof, and may be buried in the first substrate 100. The floating diffusion region FD may be provided at a side of the transfer gate TG, and the first impurity region 160 may be provided at an opposite side of the transfer gate TG. The first impurity region 160 may have a bottom surface that is spaced apart from the photoelectric conversion region 110. The first impurity region 160 may be a doped region. The first impurity region 160 may have the first conductivity type (e.g., p-type) that is the same as that of the first substrate 100. The first impurity region 160 may be connected to a ground (GND) voltage.

Each of the unit pixel regions PX may include an auxiliary isolation pattern 170. The auxiliary isolation pattern 170 may be provided in the first substrate 100. The auxiliary isolation pattern 170 may be provided in an upper portion of the first substrate 100. For example, the auxiliary isolation pattern 170 may be provided in a seventh trench TR7. The seventh trench TR7 may be recessed from the first surface 100a of the first substrate 100 toward the second surface 100b thereof. The auxiliary isolation pattern 170 may be a single diffusion break (SDB) layer which contacts a side of the first impurity region 160. The auxiliary isolation pattern 170 may be extended from the first surface 100a of the first substrate 100 toward the second surface 100b. A width of the auxiliary isolation pattern 170 may gradually decrease in a direction from the first surface 100a of the first substrate 100 toward the second surface 100b. The auxiliary isolation pattern 170 may have a bottom surface that is vertically spaced apart from the photoelectric conversion region 110. For example, the photoelectric conversion region 110 may be disposed between the bottom surface of the auxiliary isolation pattern 170 and the second surface 100b of the first substrate 100.

The auxiliary isolation pattern 170 may be formed of or include a silicon-containing insulating material. For example, the auxiliary isolation pattern 170 may be formed of or include at least one of silicon nitride, silicon oxide, and/or silicon oxynitride. The silicon-containing insulating material may further contain carbon (C). As another example, the auxiliary isolation pattern 170 may include a plurality of layers formed of different materials. A density of the auxiliary isolation pattern 170 may be higher than a density of the device isolation pattern 103. Concentrations of oxygen (0) and/or nitrogen (N) in the auxiliary isolation pattern 170 may be different from those in the device isolation pattern 103. For example, for the sake of description, the auxiliary isolation pattern 170 and the device isolation pattern 103 may comprise silicon nitride. The density of the silicon nitride of the auxiliary isolation pattern 170 may be greater than that of device isolation pattern 103. For example, the auxiliary isolation pattern 170 may be formed to have a concentration of nitrogen (N) greater than that of the device isolation pattern 103.

The auxiliary isolation pattern 170 may include a first auxiliary isolation pattern 170a, as shown in FIG. 5B. The first auxiliary isolation pattern 170a may be disposed between the transfer gate TG and the first impurity region 160. The first auxiliary isolation pattern 170a may be adjacent to a side surface of each of the transfer gate TG and the first impurity region 160. The first auxiliary isolation pattern 170a may be interposed between the transfer gate TG and the first impurity region 160. The transfer gate TG and the first impurity region 160 may be spaced apart from each other by the first auxiliary isolation pattern 170a. The first active pattern ACT1 and the second active pattern ACT2 may be defined by the device isolation pattern 103 and the first auxiliary isolation pattern 170a.

Since the first auxiliary isolation pattern 170a is provided between the transfer gate TG and the first impurity region 160, it may suppress a white spot issue, which is caused by an electric field between the transfer gate TG and the first impurity region 160. As will be described below, the first auxiliary isolation pattern 170a may be formed by a process different from that for the device isolation pattern 103, which allows more freedom in the design of the image sensor.

Referring to FIGS. 4 and 5B, the first auxiliary isolation pattern 170a may be extended lengthwise in the first direction D1, when viewed in a plan view. For example, the first auxiliary isolation pattern 170a may be extended along a region of the first substrate 100 between the transfer gate TG and the first impurity region 160 in the first direction D1. The first auxiliary isolation pattern 170a may be adjacent to each of the device isolation pattern 103 and the pixel isolation pattern 150 in the first direction D1.

Referring to FIGS. 4 and 5C, the reset transistor RX on the fourth active pattern ACT4 may include the reset gate RG and a second impurity region DR. The second impurity region DR may be adjacent to the first surface 100a of the first substrate 100. The second impurity region DR may be provided in an upper portion of the first substrate 100. The second impurity region DR may be adjacent to a side surface of the device isolation pattern 103. The second impurity region DR may be provided in the third active pattern ACT3 and the fourth active pattern ACT4. A bottom surface of the second impurity region DR may be spaced apart from the photoelectric conversion region 110. The second impurity region DR may be a doped region. In an embodiment, the second impurity region DR may have a second conductivity type (e.g., n-type) that is different from that of the first substrate 100.

The device isolation pattern 103 may be provided between the second active pattern ACT2 and the third active pattern ACT3, between the first active pattern ACT1 and the third active pattern ACT3, between the second active pattern ACT2 and the fourth active pattern ACT4, and between the first active pattern ACT1 and the fourth active pattern ACT4. The device isolation pattern 103 may be provided between the first impurity region 160 and the second impurity region DR.

The smallest width, at the level of the first surface 100a, of the device isolation pattern 103, which is provided between the active patterns on the unit pixel regions PX, may be a third width W3. The third width W3 may be the smallest width of the device isolation pattern 103, which is provided between the second active pattern ACT2 and the third active pattern ACT3, and between the first active pattern ACT1 and the third active pattern ACT3, at the level of the first surface 100a. The third width W3 may be the smallest width of the device isolation pattern 103, which is provided between the second active pattern ACT2 and the fourth active pattern ACT4 and between the first active pattern ACT1 and the fourth active pattern ACT4.

The width, in the second direction D2, of the first auxiliary isolation pattern 170a in the first surface 100a may be a fourth width W4. The first auxiliary isolation pattern 170a may extend lengthwise in the first direction D1 with a uniform width in the second direction D2. Here, the fourth width W4 may be smaller than the third width W3. For example, the third width W3 may have a value from 750 Å to 1000 Å, and the fourth width W4 may have a value from 120 Å to 600 Å.

Referring to FIGS. 4, 5A, and 5D, the device isolation pattern 103 may have a bottom surface that is located at a first level LV1. The auxiliary isolation pattern 170 may have a bottom surface that is located at a second level LV2. The first level LV1 may be different from the second level LV2. For example, the second level LV2 may be higher than the first level LV1. As another example, the second level LV2 may be lower than the first level LV1. A depth of the auxiliary isolation pattern 170 may be smaller than a depth of the device isolation pattern 103.

As will be described below, the auxiliary isolation pattern 170 and the device isolation pattern 103 may be formed through separate processes. The auxiliary isolation pattern 170 may be formed to have a width smaller than that of the device isolation pattern 103, which allows reduction of restrictions on designing and fabricating of the image sensor.

The first interconnection layer 20 may include insulating layers 221, 222, 223, and 224, interconnection lines 212 and 213, vias 215, and contacts CT. The insulating layers 221, 222, 223, and 224 may include a first insulating layer 221, a second insulating layer 222, a third insulating layer 223, and a fourth insulating layer 224. The first insulating layer 221 may cover the first surface 100a of the first substrate 100. The second insulating layer 222 may be provided on the first insulating layer 221. The first and second insulating layers 221 and 222 may be provided between the interconnection lines 212 and 213 and the first surface 100a of the first substrate 100 to cover the gate electrodes TG, SEL, SF, RG, and DCG. The third insulating layer 223 may be provided on the second insulating layer 222, and the fourth insulating layer 224 may be provided on the third insulating layer 223. The first to fourth insulating layers 221, 222, 223, and 224 may be formed of or include at least one of non-conductive materials. For example, the first to fourth insulating layers 221, 222, 223, and 224 may be formed of or include at least one of silicon-containing insulating materials (e.g., silicon oxide, silicon nitride, and/or silicon oxynitride).

The interconnection lines 212 and 213 may be provided on the second insulating layer 222. The interconnection lines 212 and 213 may be vertically connected to the transfer transistors TX, the source follower transistors SX, the reset transistors RX, the dual conversion transistors DCX, and the selection transistors AX through the contacts CT. The interconnection lines 212 and 213 may be vertically connected to the floating diffusion region FD and the first impurity region 160 through the contacts CT. The contacts CT may be provided to penetrate the first and second insulating layers 221 and 222. The contacts CT corresponding to the gate electrodes TG, SEL, SF, RG, and DCG may be provided to penetrate the gate spacer GS. Electrical signals, which are generated in the photoelectric conversion regions 110, may be processed in the first interconnection layer 20. The interconnection lines 212 and 213 may be arranged, regardless of the arrangement of the photoelectric conversion regions 110, and the arrangement of the interconnection lines 212 and 213 is not limited to the illustrated arrangement, and may be variously changed. The interconnection lines 212 and 213 may include first interconnection lines 212 and second interconnection lines 213. The first interconnection lines 212 may be provided in the third insulating layer 223. The second interconnection lines 213 may be provided in the fourth insulating layer 224. The vias 215 may be provided in the third and fourth insulating layers 223 and 224. The vias 215 may electrically connect the first and second interconnection lines 212 and 213 to each other. The first and second interconnection lines 212 and 213, the vias 215, and the contacts CT may be formed of or may include at least one of metallic materials. For example, the first and second interconnection lines 212 and 213, the vias 215, and the contacts CT may be formed of or may include copper (Cu).

The optically-transparent layer 30 may include color filters 303 and micro lenses 307. The optically-transparent layer 30 may collect and filter light, which is incident from the outside, and then to provide the light to the photoelectric conversion layer 10.

The color filters 303 and the micro lenses 307 may be provided on the second surface 100b of the first substrate 100. The color filters 303 may be disposed on the unit pixel regions PX, respectively. The micro lenses 307 may be disposed on the color filters 303, respectively. An anti-reflection layer 132, and first and second insulating layers 134 and 136 may be disposed between the second surface 100b of the first substrate 100 and the color filters 303. The anti-reflection layer 132 may prevent light, which is incident into the second surface 100b of the first substrate 100, from being reflected, and this may allow the light to be effectively incident into the photoelectric conversion regions 110. A third insulating layer 305 may be disposed between the color filters 303 and the micro lenses 307.

The color filters 303 may include primary color filters. The color filters 303 may include first to third color filters having different colors from each other. In an embodiment, the first to third color filters may include green, red, and blue color filters. The first to third color filters may be arranged in a Bayer pattern. In another embodiment, the first to third color filters may be provided to have other colors, such as cyan, magenta, or yellow.

The micro lenses 307 may have a convex shape, and in this case, it may be possible to more effectively condense light, which is incident into the unit pixel regions PX. When viewed in a plan view, the micro lenses 307 may be overlapped with the photoelectric conversion regions 110, respectively.

Figure 6:
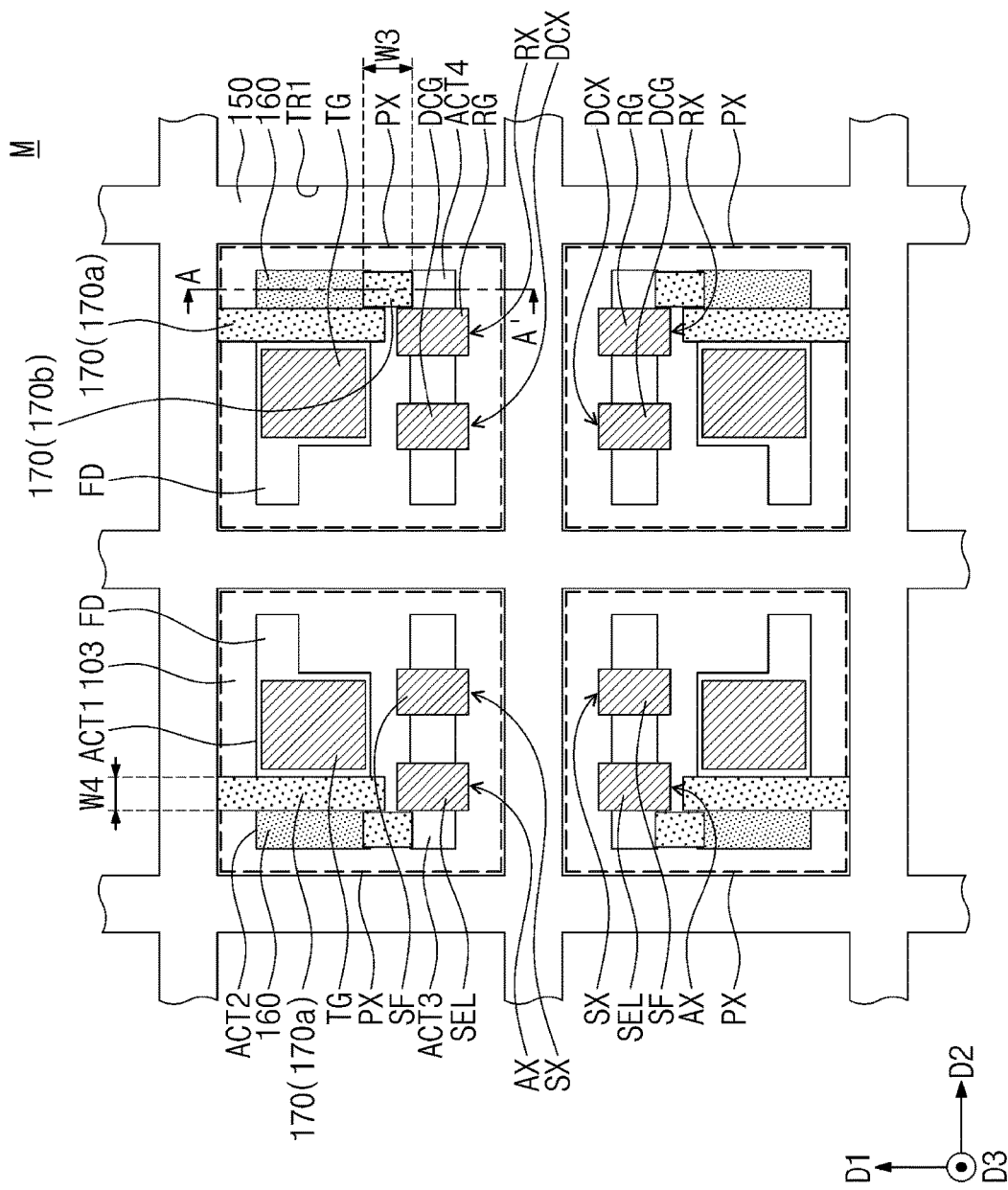
FIG. 6 is a plan view illustrating an image sensor according to an embodiment of the inventive concept.
Figure 7:
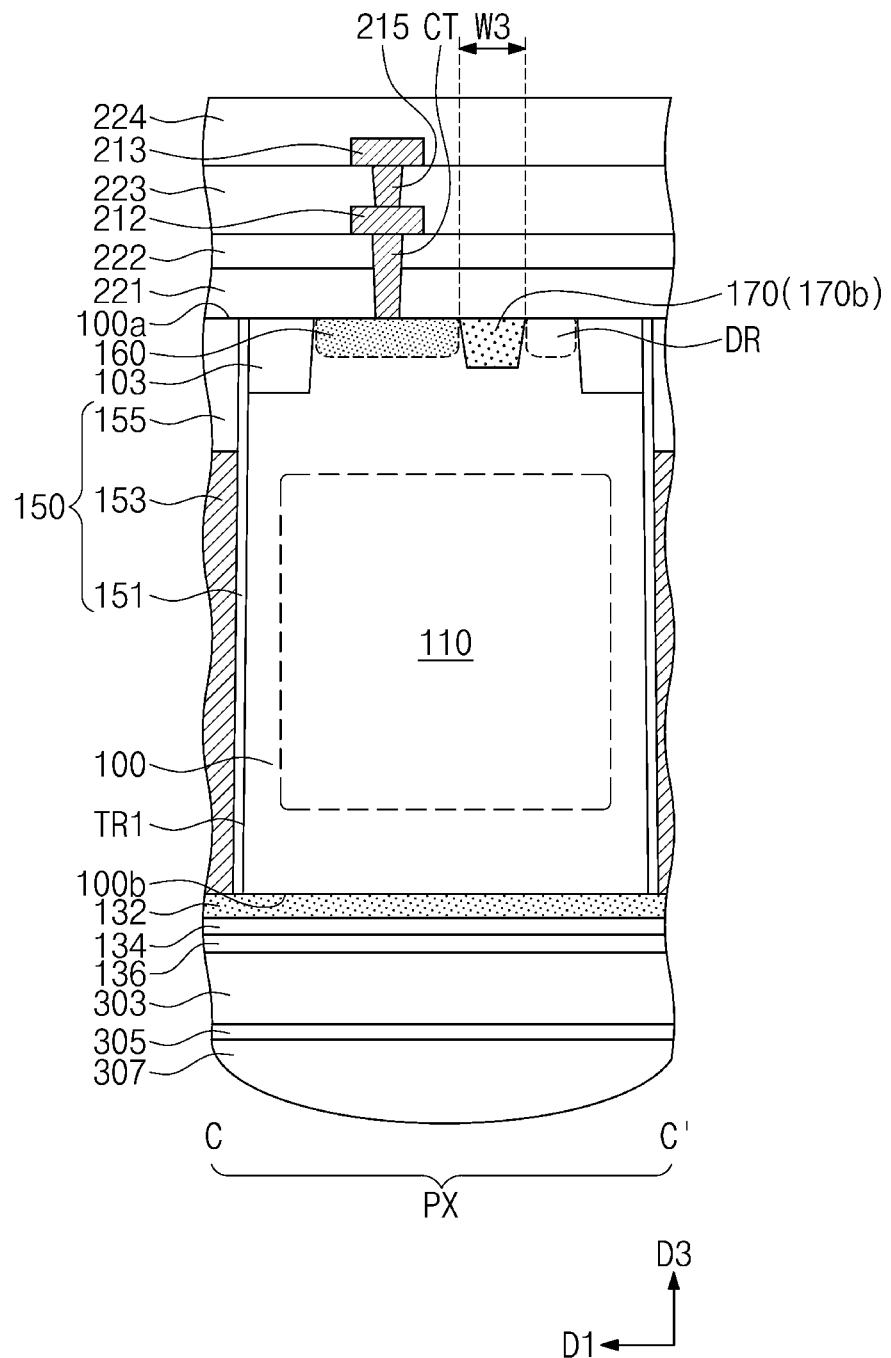
FIG. 7 is a sectional view taken along a line A-A' of FIG. 6.

FIG. 6 is a plan view illustrating an image sensor according to an embodiment of the inventive concept. FIG. 7 is a sectional view taken along a line A-A' of FIG. 6. For concise description, a previously described element may be identified by the same reference number without repeating an overlapping description thereof.

Referring to FIGS. 6 and 7, a plurality of auxiliary isolation patterns 170 may be provided on each of the unit pixel regions PX. The auxiliary isolation patterns 170 may include a first auxiliary isolation pattern 170a, which is described with reference to FIGS. 1 through 5D, and a second auxiliary isolation pattern 170b.

When viewed in a plan view, the second auxiliary isolation pattern 170b may be provided between the second active pattern ACT2 and the third active pattern ACT3 and between the second active pattern ACT2 and the fourth active pattern ACT4. The second auxiliary isolation pattern 170b may electrically separate the first impurity region 160 from the second impurity region DR. For example, the second auxiliary isolation pattern 170b may electrically separate the first impurity region 160 from the reset transistor RX. The second auxiliary isolation pattern 170b may also electrically separate the first impurity region 160 from the selection transistor AX. As such, the second auxiliary isolation pattern 170b may be provided as an alternative to the device isolation pattern 103, at a position for electrical isolation.

FIGS. 8A to 8G are sectional views, which are taken along the line A-A' of FIG. 4 to illustrate a method of fabricating an image sensor according to an embodiment of the inventive concept. The present embodiment will be described with reference to FIGS. 8A to 8G in conjunction with FIG. 4.

Figure 8A:
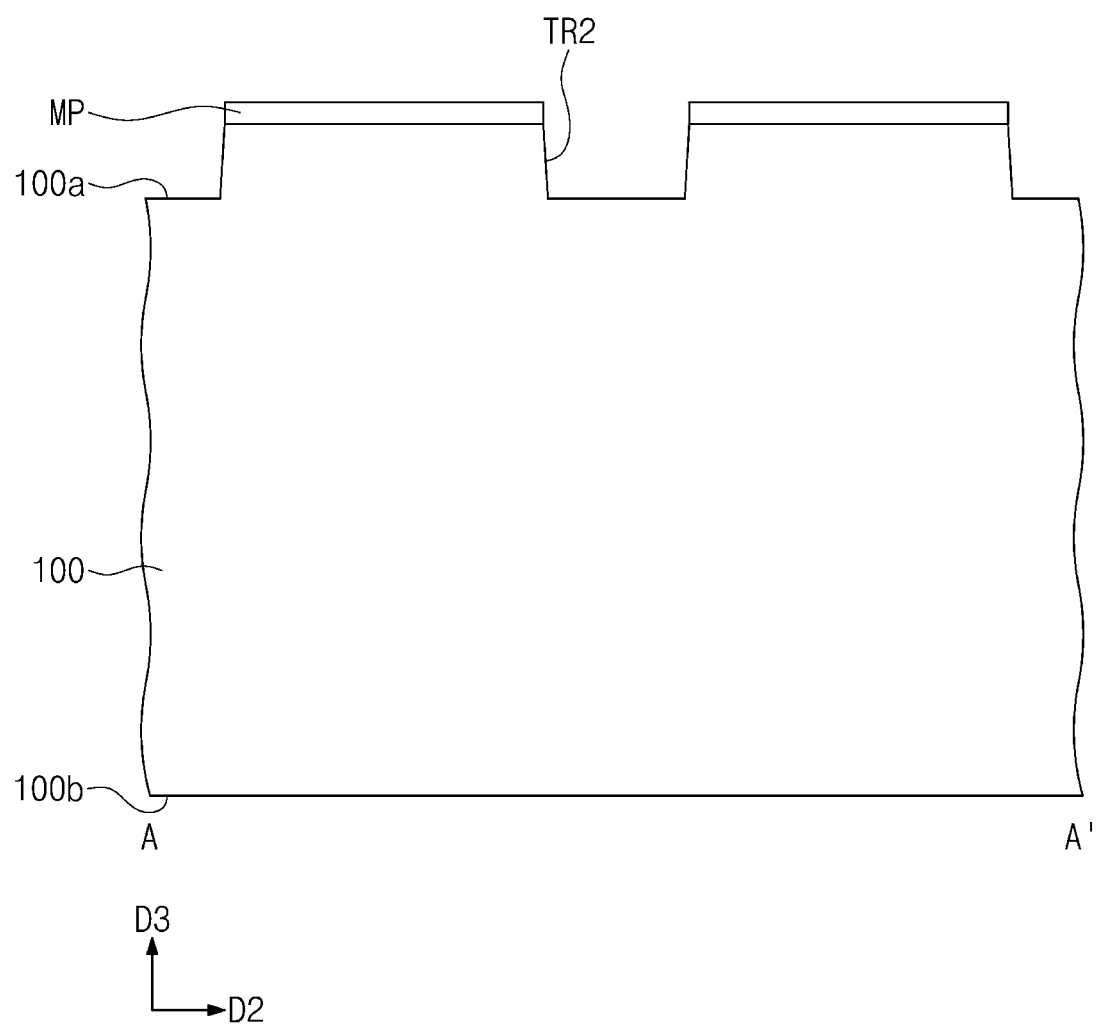
FIGS. 8A to 8G are sectional views, which are taken along the line A-A' of FIG. 4 to illustrate a method of fabricating an image sensor according to an embodiment of the inventive concept.

Referring to FIGS. 3 and 8A, the first substrate 100 having two opposite surfaces (e.g., the first and second surfaces 100a and 100b) may be prepared. The first substrate 100 may include a pixel array region AR, an optical black region OB, and a pad region PAD. The first substrate 100 may contain impurities of the first conductivity type (e.g., p-type). For example, the first substrate 100 may be provided to have a bulk silicon wafer (e.g., of the first conductivity type) and an epitaxial layer (e.g., of the first conductivity type) formed on the bulk silicon wafer. As another example, the first substrate 100 may be a bulk substrate, in which a well of the first conductivity type is formed.

The second trench TR2 may be formed on the first surface 100a of the first substrate 100. The formation of the second trench TR2 may include forming a mask pattern MP on the first surface 100a of the first substrate 100 and performing an etching process on the first surface 100a using the mask pattern MP.

Figure 8B:
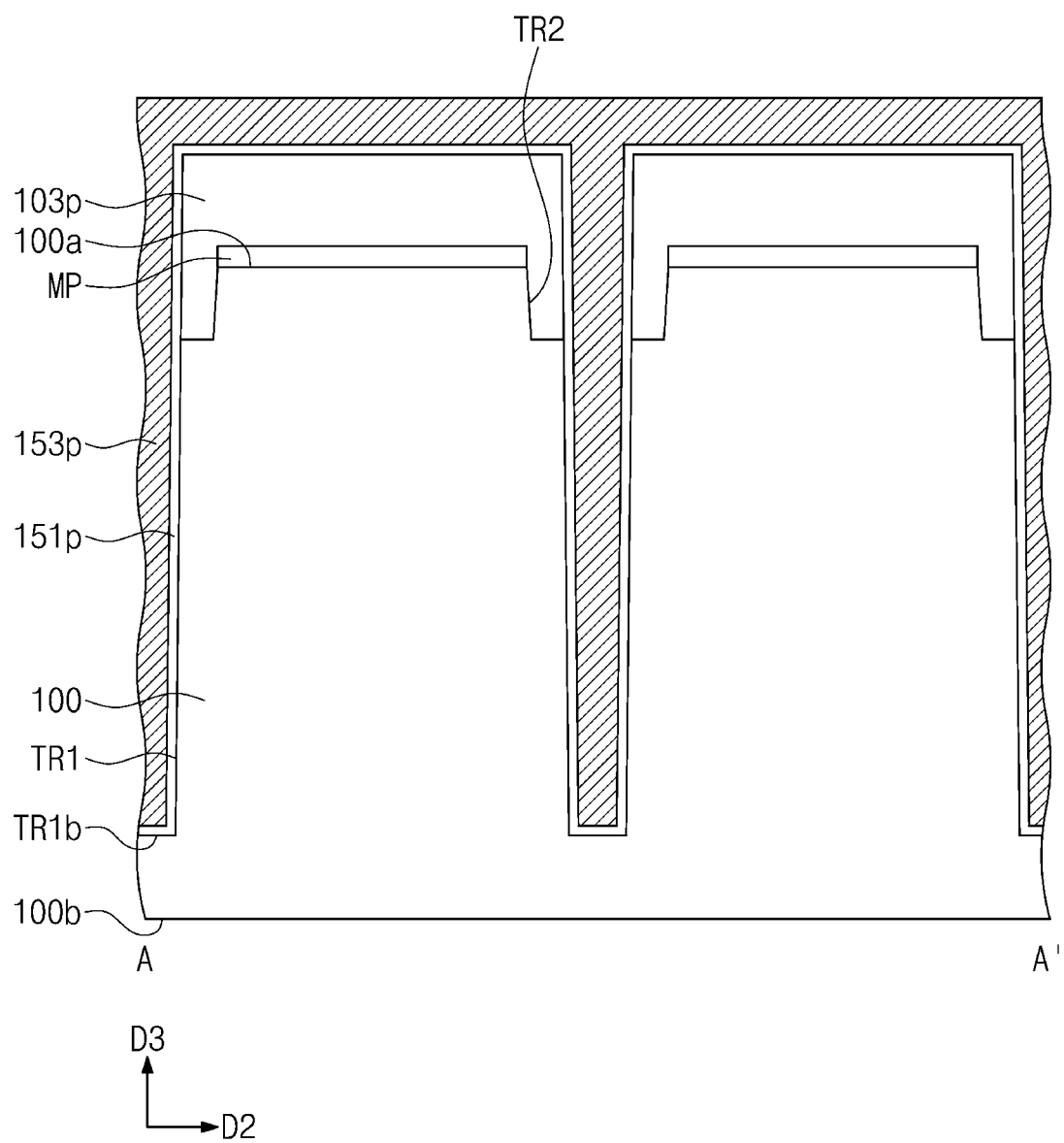

Referring to FIG. 8B, the first trench TR1 may be formed in the first substrate 100 through the first surface 100a. In an embodiment, a preliminary device isolation pattern 103p may be formed on the first surface 100a of the first substrate 100, before the formation of the first trench TR1. The preliminary device isolation pattern 103p may be formed by performing a deposition process on the first surface 100a of the first substrate 100. The preliminary device isolation pattern 103p may be formed to fully fill the second trench TR2 and to cover the mask pattern MP. A top surface of the preliminary device isolation pattern 103p may be formed at a level higher than the first surface 100a of the first substrate 100. The first trench TR1 may be formed by forming a first mask (not shown) on the preliminary device isolation pattern 103p and then anisotropically etching the preliminary device isolation pattern 103p and the first substrate 100. A bottom surface TR1b of the first trench TR1 may be located at a level higher than the second surface 100b of the first substrate 100. The preliminary device isolation pattern 103p may be formed of or may include at least one of, for example, silicon oxide, silicon nitride, and/or silicon oxynitride.

After the formation of the first trench TR1, a first preliminary isolation pattern 151p (i.e., a preliminary isolation liner) may be formed to conformally cover an inner surface of the first trench TR1, and the first preliminary isolation pattern 151p may cover the inner surface of the first trench TR1 and the top surface of the preliminary device isolation pattern 103p. The first preliminary isolation pattern 151p may be formed by depositing an insulating material on the first substrate 100 with the first trench TR1. The first preliminary isolation pattern 151p may be formed of or may include at least one of, for example, silicon oxide, silicon nitride, and/or silicon oxynitride.

A second preliminary isolation pattern 153p (i.e., a preliminary isolation filler) may be formed on the first preliminary isolation pattern 151p. The second preliminary isolation pattern 153p may be formed by performing a deposition process on the first substrate 100 provided with the first preliminary isolation pattern 151p. The second preliminary isolation pattern 153p may be formed to fill the first trench TR1 covered with the first preliminary isolation pattern 151p and to cover the top surface of the preliminary device isolation pattern 103p covered with the first preliminary isolation pattern 151p. The second preliminary isolation pattern 153p may be formed of or may include, for example, polycrystalline silicon.

Figure 8C:
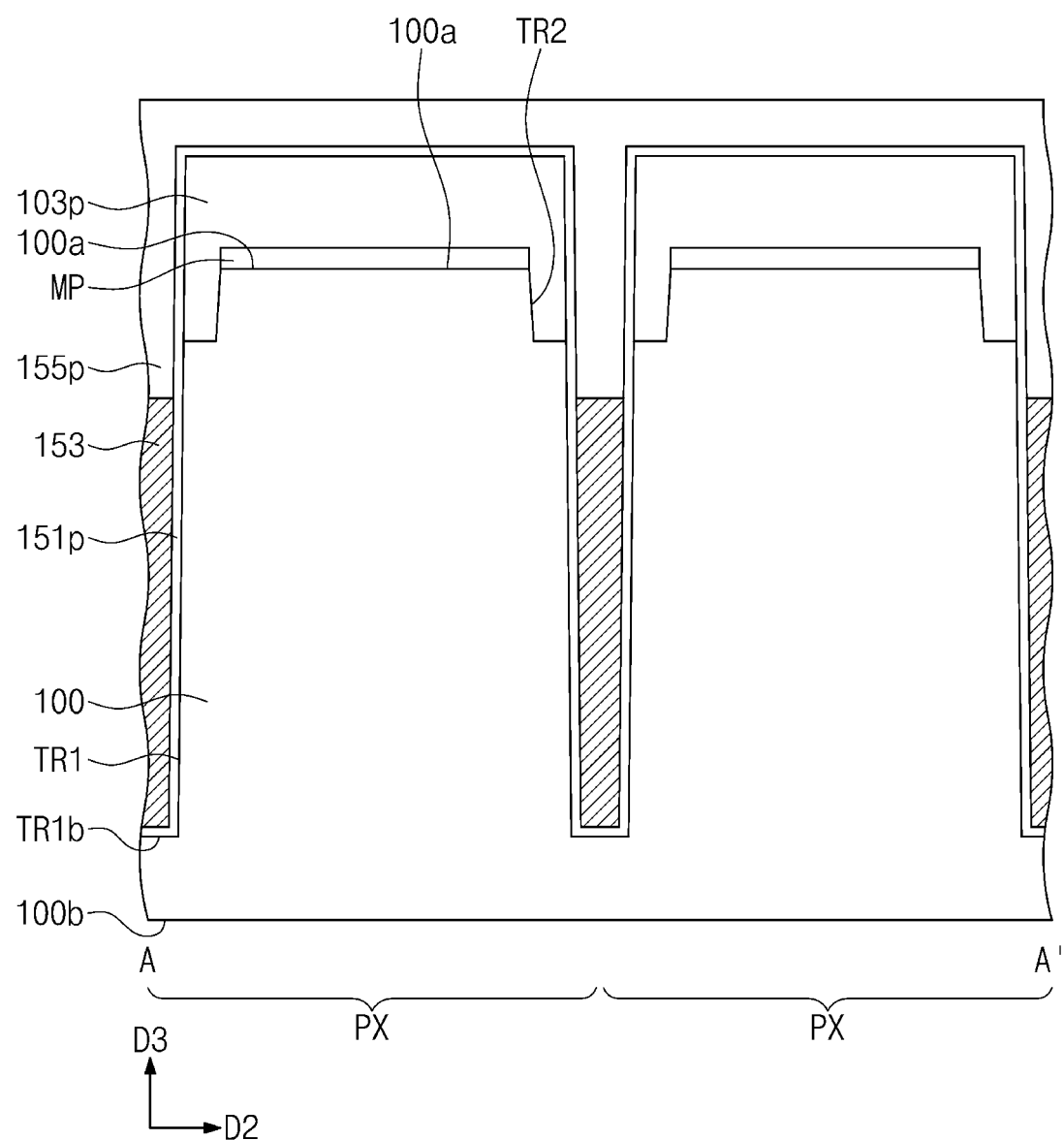

Referring to FIG. 8C, a first etching process may be performed to remove an upper portion of the second preliminary isolation pattern 153p. As a result, the second isolation pattern 153 may be formed to expose a portion of the first preliminary isolation pattern 151p to the outside. The first etching process may be performed to lower the top surface of the second isolation pattern 153 to a level lower than a bottom surface of the preliminary device isolation pattern 103p.

According to an embodiment, a doping process may be performed on the second isolation pattern 153, after the first etching process. The doping process may be, for example, a beam-line ion implantation process or a plasma doping (PLAD) process. In the case of the plasma doping process, a source material in a gaseous state may be supplied into a process chamber. Then, the source material may be ionized to form a plasma, and the ionized source materials may be injected into the second isolation pattern 153 by applying a bias of high voltage to an electrostatic chuck (not shown) provided with the first substrate 100. By using the plasma doping process, it may be possible to realize a uniform doping profile even at a deep level and to reduce a process time for the doping process. In the case of the beam-line ion implantation process, it may be difficult to reduce a vertical variation in doping concentration of the second isolation pattern 153, because the first trench TR1 has a relatively small width and a relatively large depth. Accordingly, in the case where the doping process is performed using the beam-line ion implantation process, a concentration of impurities in the second isolation pattern 153 may vary depending on a vertical depth. A dark current property of the image sensor may be improved by applying a negative voltage to the second isolation pattern 153.

A preliminary capping pattern 155p may be formed to fully cover the first substrate 100 and to fill an upper portion of the first trench TR1. The forming of the preliminary capping pattern 155p may include performing a deposition process on the first surface 100a of the first substrate 100. The preliminary capping pattern 155p may be formed of or may include silicon oxide, silicon nitride, and/or silicon oxynitride.

Figure 8D:
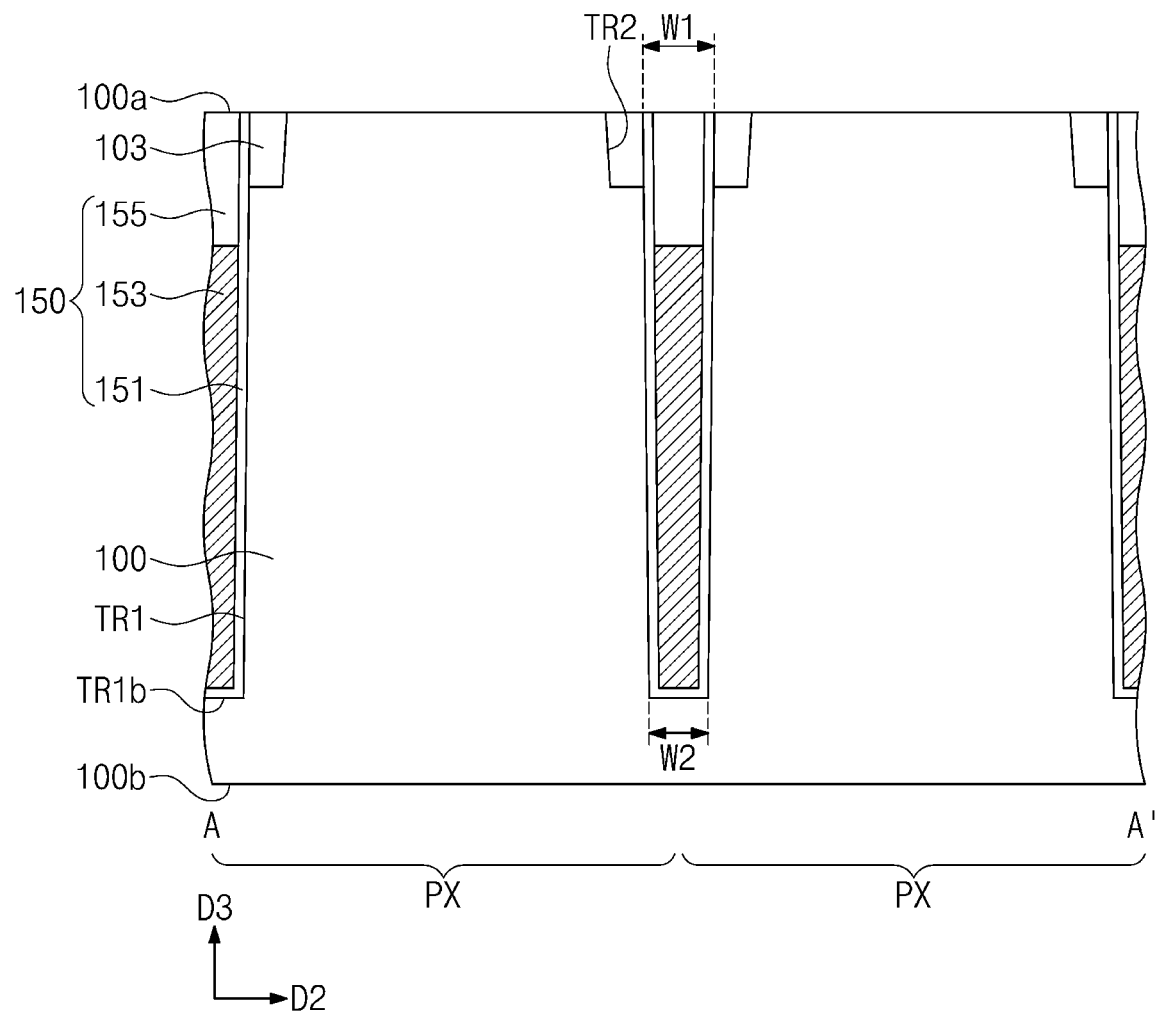

Referring to FIG. 8D, the capping pattern 155 and the device isolation pattern 103 may be formed. The formation of the capping pattern 155 and the device isolation pattern 103 may include performing a planarization process on the first surface 100a of the first substrate 100. In an embodiment, the mask pattern MP may be removed after the planarization process. Thus, it may be possible to prevent the first surface 100a of the first substrate 100 from being damaged by the planarization process. Although not shown, the third active pattern ACT3 and the fourth active pattern ACT4 described with reference to FIG. 4 may be formed as a result of the planarization process.

Figure 8E:
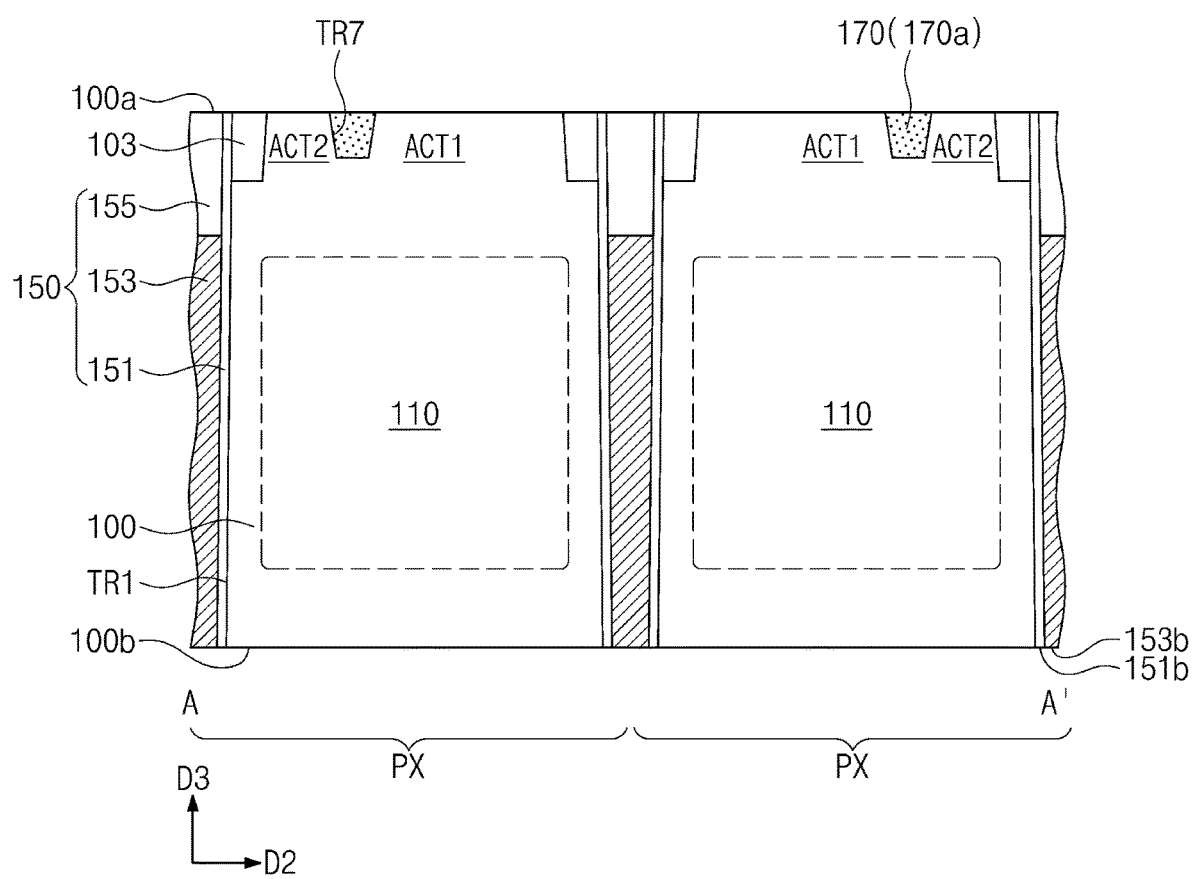

Referring to FIG. 8E, the photoelectric conversion regions 110 may be formed in the unit pixel regions PX, respectively, by an impurity doping process. The photoelectric conversion regions 110 may be formed to have a second conductivity type (e.g., n-type), which is different from the first conductivity type (e.g., p-type). In an embodiment, a thinning process may be performed to remove a portion of the first substrate 100 or to reduce a vertical thickness of the first substrate 100. The thinning process may include grinding or polishing the second surface 100b of the first substrate 100 and anisotropically or isotropically etching the second surface 100b of the first substrate 100. For the thinning of the first substrate 100, the first substrate 100 may be inverted. In an embodiment, the grinding or polishing process may be performed to remove a portion of the first substrate 100, and then, an anisotropic or isotropic etching process may be performed to remove surface defects of the first substrate 100.

The thinning process of the second surface 100b of the first substrate 100 may be performed to expose bottom surfaces 151b and 153b of the first and second isolation patterns 151 and 153. For example, after the thinning process, the bottom surfaces 151b and 153b of the first and second isolation patterns 151 and 153 may be located at substantially the same level as the second surface 100b of the first substrate 100.

The seventh trench TR7 may be formed on the first surface 100a of the first substrate 100. The formation of the seventh trench TR7 may include forming a second mask (not shown) on the first surface 100a of the first substrate 100 and anisotropically etching the first substrate 100 to form the seventh trench TR7. After the formation of the seventh trench TR7, the auxiliary isolation pattern 170 may be formed to fill the seventh trench TR7. The auxiliary isolation pattern 170 may be formed of or may include at least one of, for example, silicon oxide, silicon nitride, and/or silicon oxynitride. A bottom surface of the auxiliary isolation pattern 170 may be at a level different from a level of a bottom surface of the device isolation pattern 103. For example, the bottom surface of the auxiliary isolation pattern 170 may be higher than the bottom surface of the device isolation pattern 103.

The first active pattern ACT1 and the second active pattern ACT2 may be defined by the device isolation pattern 103 and the first auxiliary isolation pattern 170a. The first active pattern ACT1 and the second active pattern ACT2 may be spaced apart from each other by the first auxiliary isolation pattern 170a. Although not shown, the second auxiliary isolation pattern 170b described with reference to FIGS. 6 and 7 may be additionally formed.

The smallest width of the device isolation pattern 103, which is provided between the active patterns on the unit pixel regions PX, at the level of the first surface 100a may be a third width W3. The width of the first auxiliary isolation pattern 170a at the level of the first surface 100a may be a fourth width W4. The third width W3 may be larger than the fourth width W4. For example, the third width W3 may range from 750 Å to 1000 Å. The device isolation pattern 103 may have a bottom surface that is located at the first level LV1. The auxiliary isolation pattern 170 may have a bottom surface that is located at the second level LV2. The first level LV1 may be different from the second level LV2. For example, the first level LV1 may be lower than the second level LV2. As another example, the first level LV1 may be higher than the second level LV2.

As described above, the auxiliary isolation pattern 170 and the device isolation pattern 103 may be formed through separate processes. In the case where the device isolation pattern is formed in an upper portion of a substrate and an impurity injection process is performed, designing of an image sensor may be restricted by widths of the device isolation pattern and the impurity-injected region. In contrast, according to an embodiment of the inventive concept, since the auxiliary isolation pattern of a relatively small width is used to replace at least a portion of the device isolation patterns, an integration density of an image sensor may increase, and the freedom of designing and fabrication of the image sensor may increase.

Figure 8F:
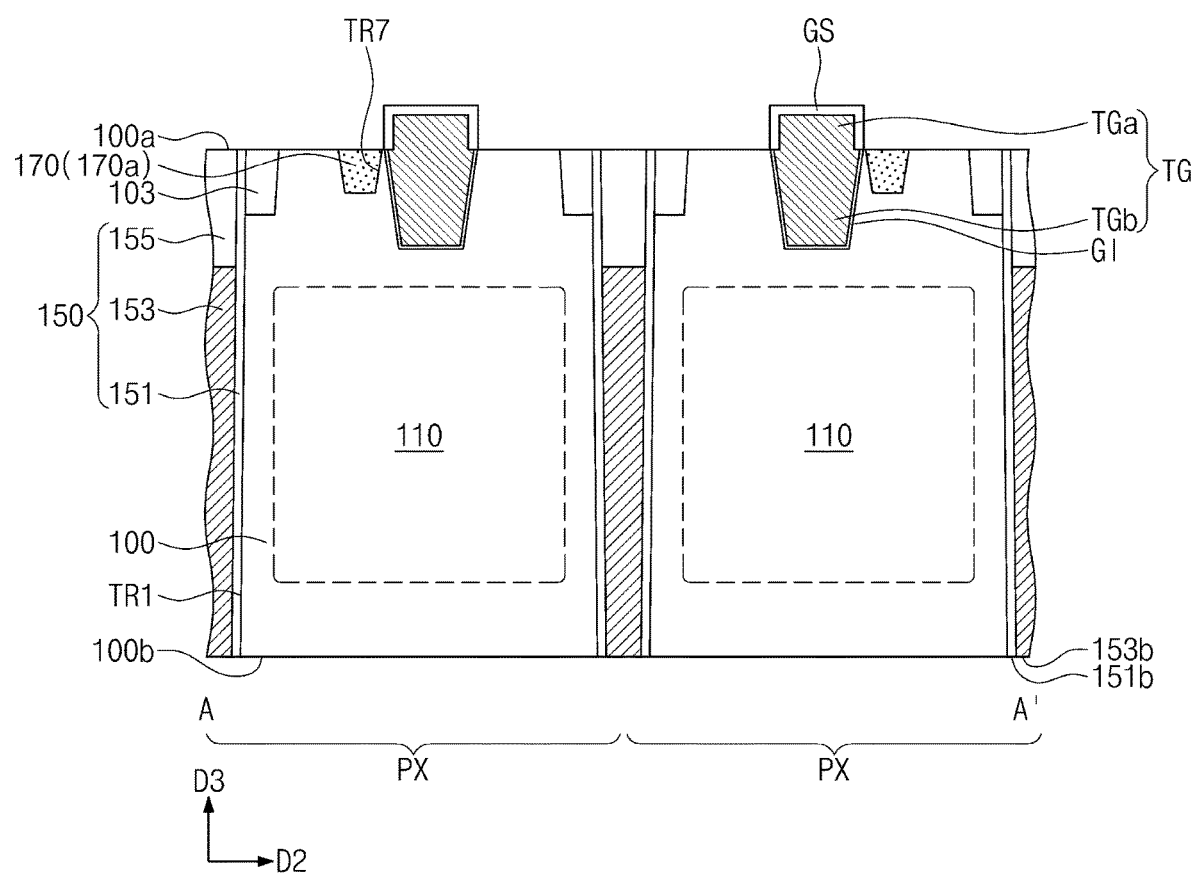

Referring to FIG. 8F, the transfer gate TG may be formed on the first active pattern ACT1. The transfer gate TG may be adjacent to a side surface of the first auxiliary isolation pattern 170a. The transfer gate TG may include the first portion TGa, which protrudes from the first surface 100a of the first substrate 100, and the second portion TGb, which is extended from the first portion TGa into the first substrate 100 and is buried therein. The largest width of the first portion TGa may be smaller than the largest width of the second portion TGb. The gate dielectric layer GI may be interposed between the first substrate 100 and the transfer gate TG. The gate dielectric layer GI may be extended along the side and bottom surfaces of the second portion TGb. The gate spacer GS may be formed on the transfer gate TG. The gate spacer GS may cover the top and side surfaces of the first portion TGa. The gate spacer GS may be formed of or may include at least one of, for example, silicon nitride, silicon carbonitride, or silicon oxynitride.

Figure 8G:
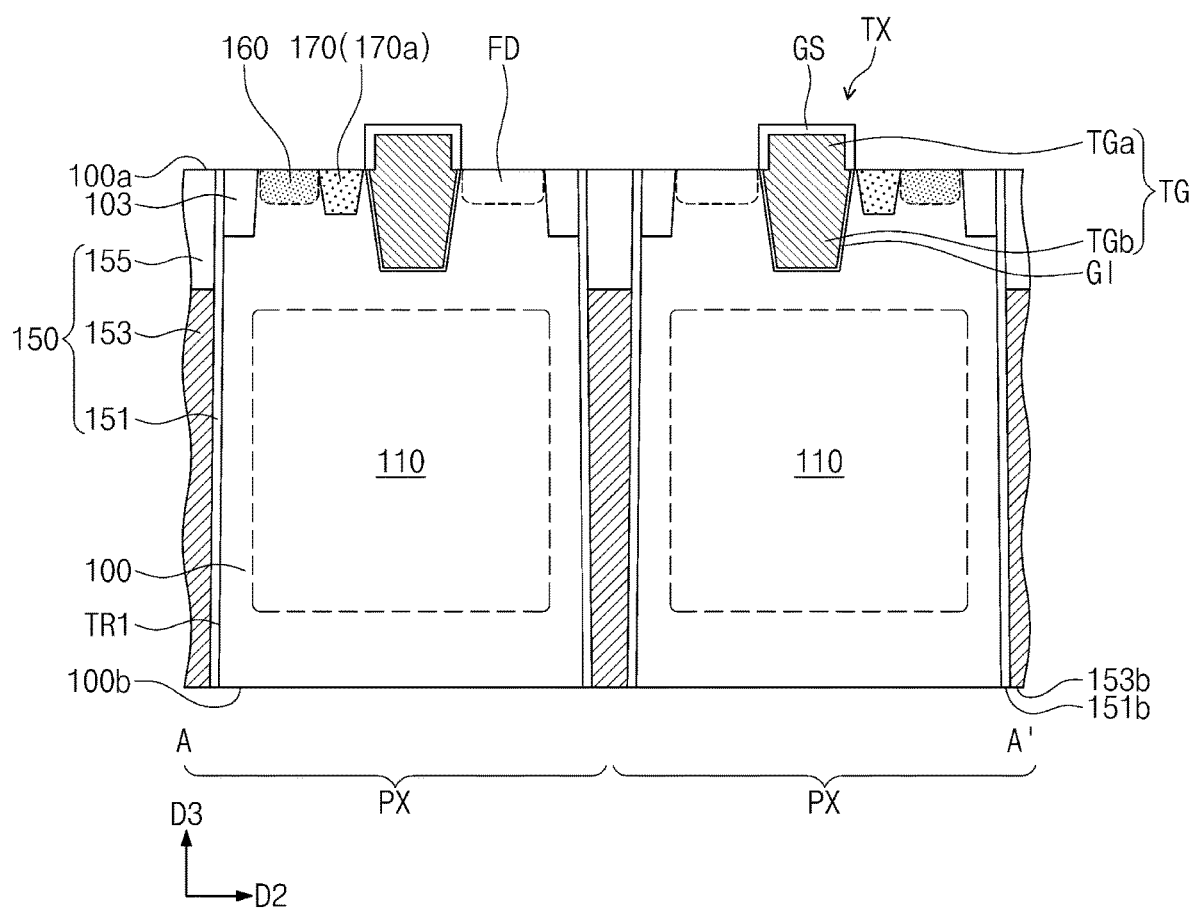

Referring to FIG. 8G, the first impurity region 160 and the floating diffusion region FD may be formed by injecting impurities into the first substrate 100 through the first surface 100a. The impurity injection process may be performed using a third mask (not shown). For example, the impurity injection process may include forming the third mask on the first surface 100a of the first substrate 100 and injecting the impurities into the first substrate 100 through the first surface 100a using the third mask. The impurities may serve as dopants in the first impurity region 160 and the floating diffusion region FD. The first impurity region 160 may include impurities of the first conductivity type (e.g., p-type). The floating diffusion region FD may include impurities of the second conductivity type (e.g., n-type). The device isolation pattern 103 may be adjacent to a side surface of each of the floating diffusion region FD and the first impurity region 160. For example, the first impurity region 160 and the floating diffusion region FD may be sequentially formed. The floating diffusion region FD may be formed in the first active pattern ACT1, and the first impurity region 160 may be formed in the second active pattern ACT2.

Although not shown, second impurity regions may be formed in upper portions of the third active pattern and the fourth active pattern. In an embodiment, the second impurity region may have a second conductivity type (e.g., n-type).

As a result, the transfer transistor TX may include the transfer gate TG and the floating diffusion region FD formed in the first active pattern ACT1. Although not shown, the source follower transistor and the selection transistor may be formed on the third active pattern, and the reset transistor and the dual conversion transistor may be formed on the fourth active pattern.

Referring back to FIG. 5A, the first interconnection layer 20 may be formed on the first surface 100a of the first substrate 100. For example, the first insulating layer 221 and the second insulating layer 222 may be formed on the first surface 100a of the first substrate 100. The first and second insulating layers 221 and 222 may be formed to cover the transfer transistor TX, the source follower transistor, the reset transistor, the dual conversion transistor, and the selection transistor, which are formed on the first surface 100a of the first substrate 100.

The contacts CT may be formed to penetrate the first and second insulating layers 221 and 222. Each of the contacts CT may be coupled to at least one of the first impurity region 160, the gate electrodes, and the floating diffusion region FD. The contacts CT corresponding to the gate electrodes may be provided to penetrate the gate spacer GS.

The first interconnection lines 212 may be formed on the top surface of the second insulating layer 222. The third insulating layer 223 may be formed on the second insulating layer 222. The third insulating layer 223 may cover the top and side surfaces of the first interconnection lines 212. The vias 215 may be formed to penetrate the third insulating layer 223. The vias 215 may electrically connect the second interconnection lines 213, which will be described below, to the first interconnection lines 212. The second interconnection lines 213 may be formed on the third insulating layer 223. The fourth insulating layer 224 may be formed on the third insulating layer 223. The fourth insulating layer 224 may cover the top and side surfaces of the second interconnection lines 213. The vias 215 may be formed to penetrate the fourth insulating layer 224. Each of the first to fourth insulating layers may be formed of or include at least one of silicon-containing insulating materials (e.g., silicon oxide, silicon nitride, and/or silicon oxynitride). The first and second interconnection lines 212 and 213, the vias 215, and the contacts CT may be formed of or include at least one of metallic materials (e.g., copper (Cu)).

The anti-reflection layer 132, a first insulating layer 134, and a second insulating layer 136 may be sequentially formed on the second surface 100b of the first substrate 100. The color filters 303 may be formed on the unit pixel regions PX, respectively. The third insulating layer 305 may be formed on the color filters 303. The micro lenses 307 may be formed on the third insulating layer 305 to be overlapped with the unit pixel regions PX, respectively.

Referring back to FIG. 3, an image sensor may further include a logic chip 2000 which controls an operation of the sensor chip 1000. The logic chip 2000 may be stacked on the sensor chip 1000. The logic chip 2000 may include a second substrate 40 and a second interconnection layer 45. The second interconnection layer 45 may be interposed between the first interconnection layer 20 and the second substrate 40.

A first connection structure 50, a first pad terminal 81, and a bulk color filter 90 may be provided on the first substrate 100 and in the optical black region OB. The first connection structure 50 may include a first light-blocking pattern 51, a first insulating pattern 53, and a first capping pattern 55. The first light-blocking pattern 51 may be provided on the second surface 100b of the first substrate 100. The first light-blocking pattern 51 may be formed to cover the second insulating layer 136 on the second surface 100b and to conformally cover inner surfaces of a third trench TR3 and a fourth trench TR4. The first light-blocking pattern 51 may penetrate the photoelectric conversion layer 10, the first interconnection layer 20, and the second interconnection layer 45 and may electrically connect the photoelectric conversion layer 10 to the first interconnection layer 20. For example, the first light-blocking pattern 51 may be in contact with interconnection lines in the first interconnection layer 20 and may be also in contact with the pixel isolation pattern 150 in the photoelectric conversion layer 10. Thus, the first connection structure 50 may be electrically connected to the interconnection lines in the first interconnection layer 20. The first light-blocking pattern 51 may prevent light from being incident into the optical black region OB.

The first pad terminal 81 may be provided in the third trench TR3 to fill a remaining space of the third trench TR3. The first pad terminal 81 may be formed of or include a metallic material (e.g., aluminum). The first pad terminal 81 may be connected to the pixel isolation pattern 150 (in particular, the second isolation pattern 153). Thus, a negative voltage may be applied to the pixel isolation pattern 150 through the first pad terminal 81.

The first insulating pattern 53 may be provided on the first light-blocking pattern 51 to fill a remaining space of the fourth trench TR4. The first insulating pattern 53 may be provided to penetrate the photoelectric conversion layer 10 and the first interconnection layer 20. The first capping pattern 55 may be provided on the first insulating pattern 53. The first capping pattern 55 may be provided on the first insulating pattern 53. The first capping pattern 55 may be formed of or include the same material as the capping pattern 155.

The bulk color filter 90 may be provided on the first pad terminal 81, the first light-blocking pattern 51, and the first capping pattern 55. The bulk color filter 90 may cover the first pad terminal 81, the first light-blocking pattern 51, and the first capping pattern 55. A first protection layer 71 may be provided on the bulk color filter 90 to cover the bulk color filter 90.

A photoelectric conversion region 110' and the dummy region 111 may be provided in the optical black region OB of the first substrate 100. The photoelectric conversion region 110' may be doped to have a second conductivity type (e.g., an n-type) that is different from the first conductivity type. The photoelectric conversion region 110' may have a structure similar to the photoelectric conversion region 110 described with reference to FIG. 5A but may not be used to convert light to an electrical signal. The dummy region 111 may be an undoped region. Signals produced from the photoelectric conversion region 110' and the dummy region 111 may be used as information for removing a process noise later.

In the pad region PAD, a second connection structure 60, a second pad terminal 83, and a second protection layer 73 may be provided on the first substrate 100. The second connection structure 60 may include a second light-blocking pattern 61, a second insulating pattern 63, and a second capping pattern 65.

The second light-blocking pattern 61 may be provided on the second surface 100b of the first substrate 100. For example, the second light-blocking pattern 61 may be formed to cover the second insulating layer 136 on the second surface 100b and to conformally cover inner surface of a fifth trench TR5 and a sixth trench TR6. The second light-blocking pattern 61 may be formed to penetrate the photoelectric conversion layer 10, the first interconnection layer 20, and a portion of the second interconnection layer 45. For example, the second light-blocking pattern 61 may be in contact with interconnection lines 231 and 232 in the second interconnection layer 45. The second light-blocking pattern 61 may be formed of or include a metallic material (e.g., tungsten).

The second pad terminal 83 may be provided in the fifth trench TR5. The second pad terminal 83 may be provided on the second light-blocking pattern 61 to fill a remaining space of the fifth trench TR5. The second pad terminal 83 may be formed of or include a metallic material (e.g., aluminum). The second pad terminal 83 may be used as an electric conduction path between the image sensor device and the outside. The second insulating pattern 63 may be formed to fill the remaining space of the sixth trench TR6. The second insulating pattern 63 may wholly or partially penetrate the photoelectric conversion layer 10 and the first interconnection layer 20. The second capping pattern 65 may be provided on the second insulating pattern 63. The second capping pattern 65 may be formed of or include the same material as the capping pattern 155. The second protection layer 73 may cover a portion of the second light-blocking pattern 61 and the second capping pattern 65.

A current, which is applied through the second pad terminal 83, may be delivered to the pixel isolation pattern 150 through the second light-blocking pattern 61, the interconnection lines 231 and 232 in the second interconnection layer 45, and the first light-blocking pattern 51. Electrical signals produced from the photoelectric conversion regions 110 and 110' and the dummy region 111 may be delivered to the outside through the interconnection lines of the first interconnection layer 20, the interconnection lines 231 and 232 in the second interconnection layer 45, the second light-blocking pattern 61, and the second pad terminal 83.

Figure 9A:
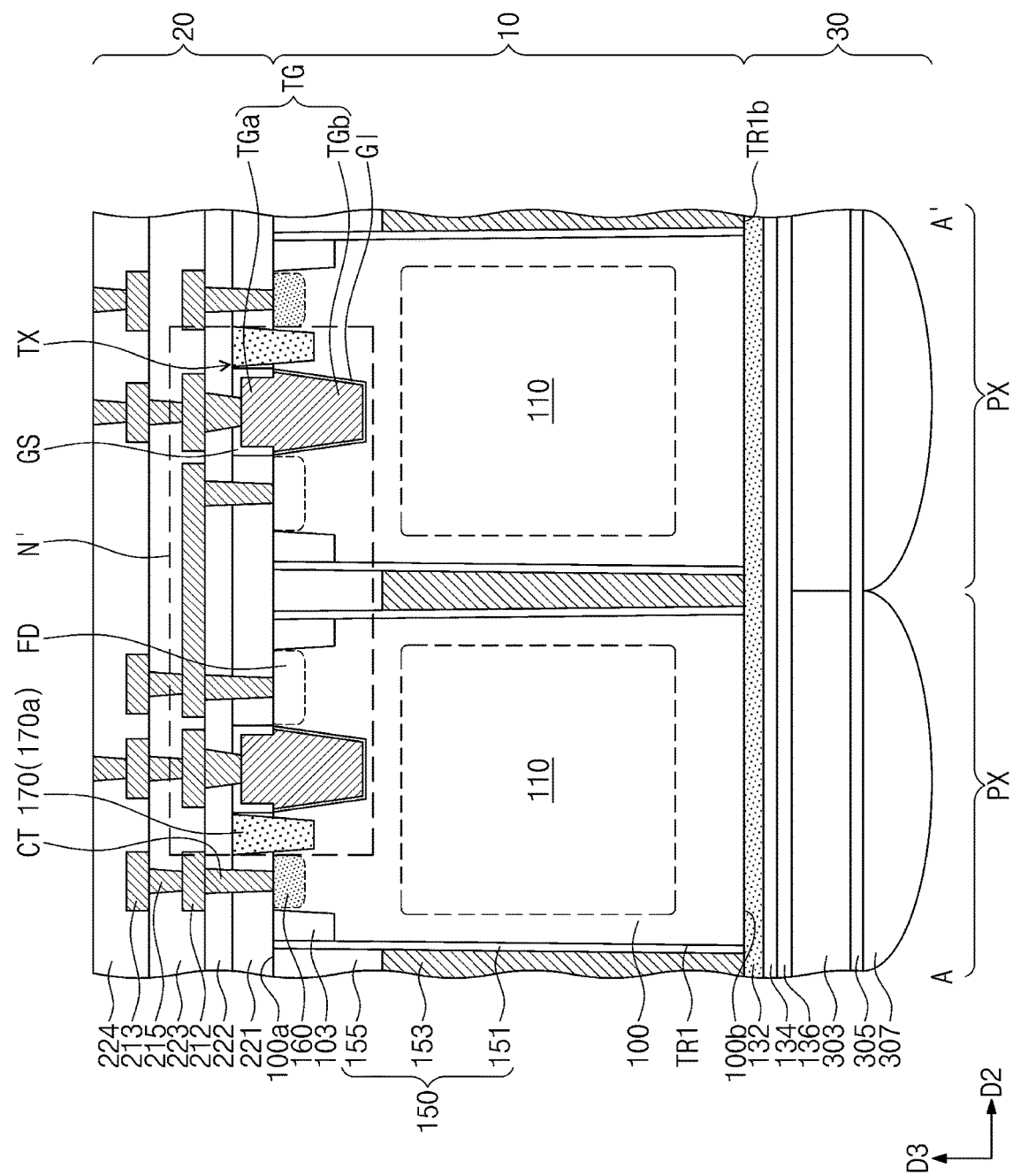
FIG. 9A is a sectional view, which is taken along the line A-A' of FIG. 4 to illustrate an image sensor according to an embodiment of the inventive concept.
Figure 9B:
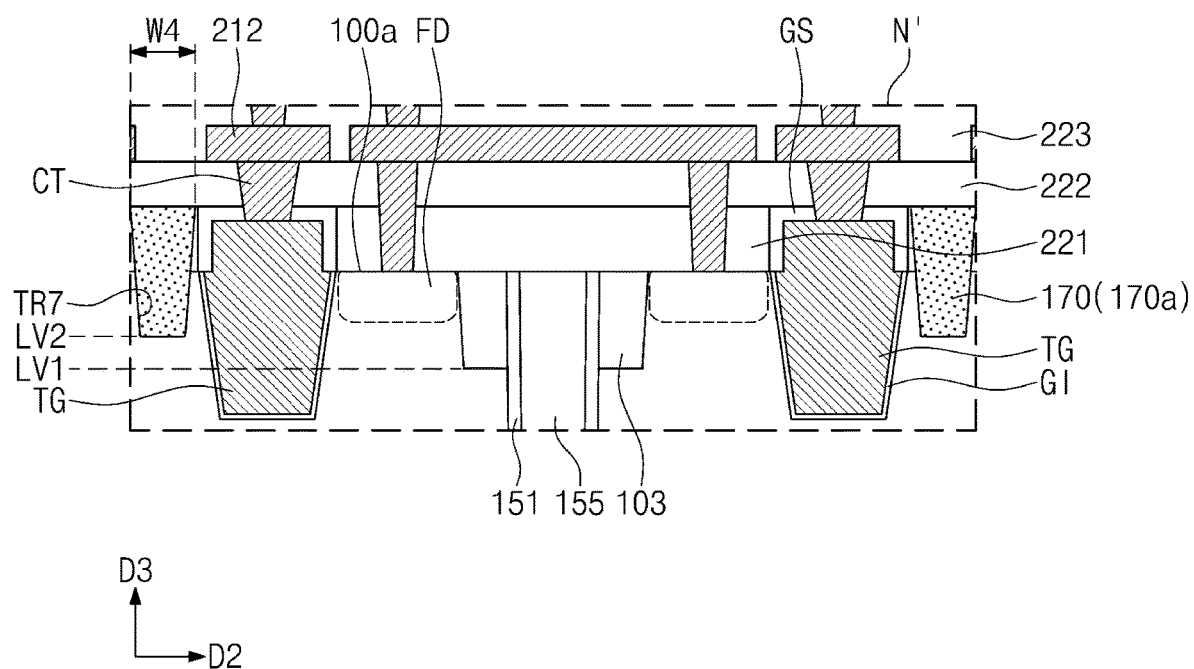
FIG. 9B is an enlarged sectional view illustrating a portion N' of FIG. 9A.

FIG. 9A is a sectional view, which is taken along the line A-A' of FIG. 4 to illustrate an image sensor according to an embodiment of the inventive concept. FIG. 9B is an enlarged sectional view illustrating a portion N' of FIG. 9A. For concise description, a previously described element may be identified by the same reference number without repeating an overlapping description thereof. The present embodiment will be described with reference to FIGS. 9A and 9B in conjunction with FIG. 4.

Referring to FIGS. 9A and 9B, the first auxiliary isolation pattern 170a may be provided to penetrate the first insulating layer 221 and may be extended into the first substrate 100. The first auxiliary isolation pattern 170a may be adjacent to the gate spacer GS. A top surface of the first auxiliary isolation pattern 170a may be substantially coplanar with the top surface of the gate spacer GS. The top surface of the first auxiliary isolation pattern 170a may be substantially coplanar with the top surface of the first insulating layer 221.

The device isolation pattern 103 may have a bottom surface that is located at the first level LV1. The auxiliary isolation pattern 170 may have a bottom surface that is located at the second level LV2. The first level LV1 may be different from the second level LV2. For example, the first level LV1 may be lower than the second level LV2. As another example, the first level LV1 may be higher than the second level LV2.

The smallest width of the device isolation pattern 103, which is provided between the active patterns on the unit pixel regions PX, at the level of the first surface 100a may be a third width W3. The width of the first auxiliary isolation pattern 170a at its top surface level may be a fourth width W4. For example, the third width W3 may be larger than the fourth width W4. The width of the first auxiliary isolation pattern 170a at the level of the first surface 100a may be smaller than the fourth width W4.

Figure 10A:
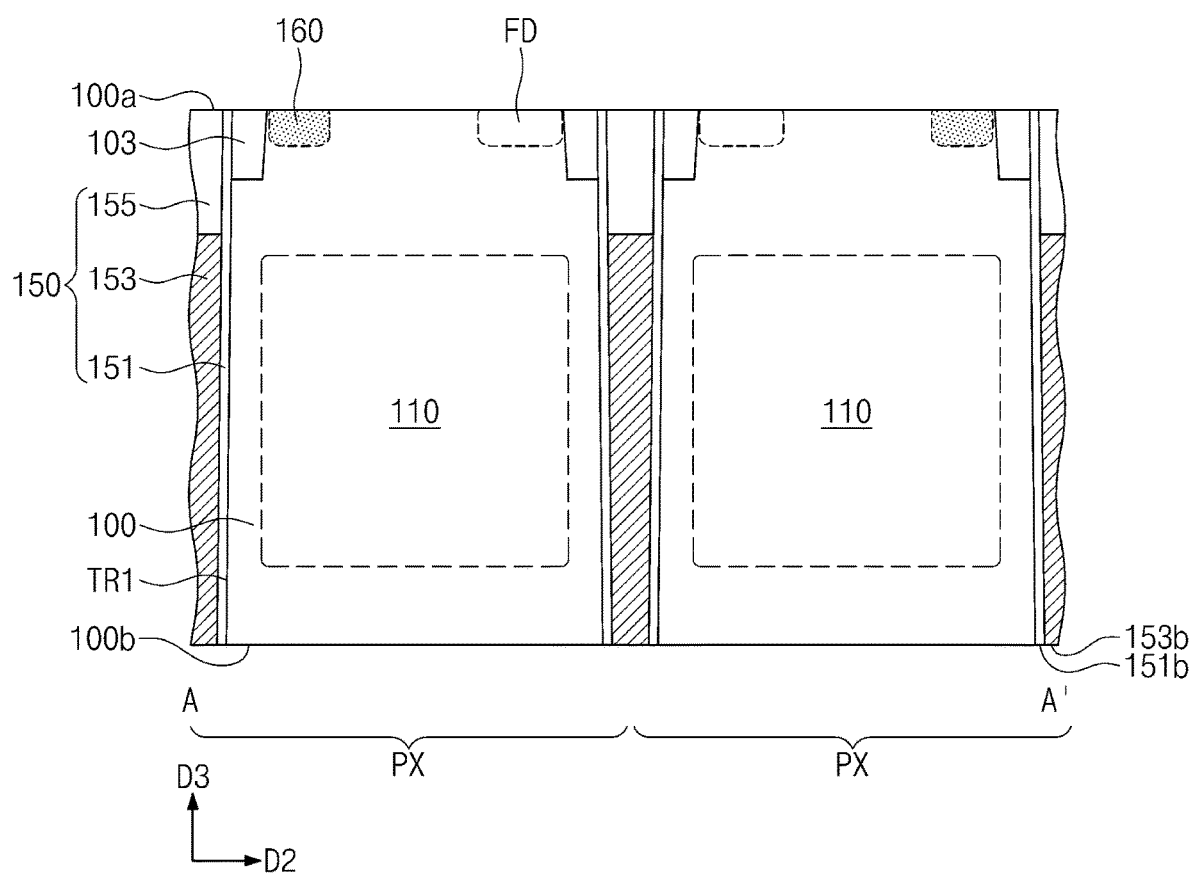
FIGS. 10A to 10C are sectional views, which are taken along the line A-A' of FIG. 4 to illustrate a method of fabricating an image sensor according to an embodiment of the inventive concept.
Figure 10B:
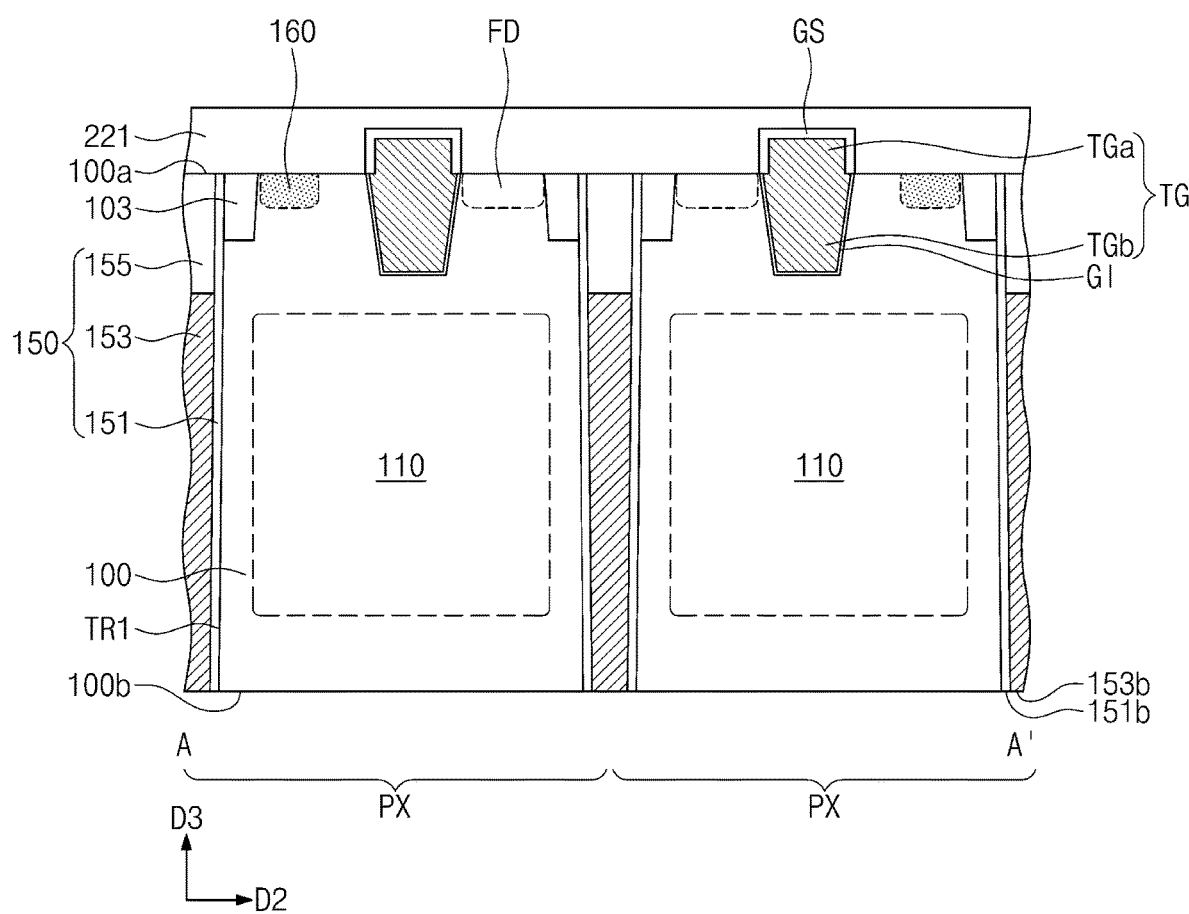
Figure 10C:
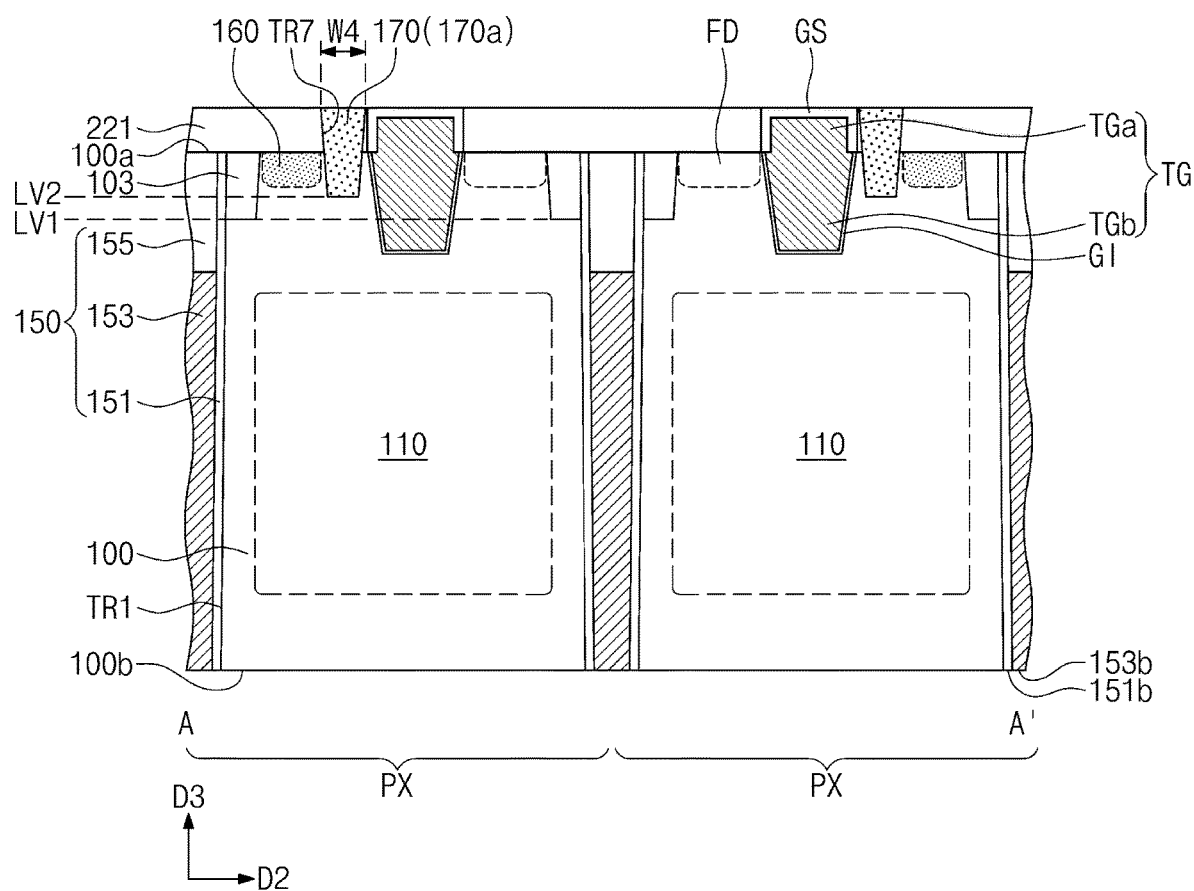

FIGS. 10A to 10C are sectional views, which are taken along the line A-A' of FIG. 4 to illustrate a method of fabricating an image sensor according to an embodiment of the inventive concept. For concise description, a previously described element may be identified by the same reference number without repeating an overlapping description thereof.

Referring to FIG. 10A, after the process described with reference to FIG. 8D, the photoelectric conversion regions 110 may be formed by doping each of the unit pixel regions PX with impurities. The photoelectric conversion regions 110 may have a second conductivity type (e.g., n-type), which is different from the first conductivity type (e.g., p-type). In an embodiment, a thinning process may be performed to remove a portion of the first substrate 100 or to reduce a vertical thickness of the first substrate 100. The thinning process may include grinding or polishing the second surface 100b of the first substrate 100 and anisotropically or isotropically etching the second surface 100b of the first substrate 100. For the thinning of the first substrate 100, the first substrate 100 may be inverted. In an embodiment, the grinding or polishing process may be performed to remove a portion of the first substrate 100, and then, an anisotropic or isotropic etching process may be performed to remove surface defects of the first substrate 100.

The thinning process of the second surface 100b of the first substrate 100 may be performed to expose bottom surfaces 151b and 153b of the first and second isolation patterns 151 and 153. The bottom surfaces 151b and 153b of the first and second isolation patterns 151 and 153 may be located at substantially the same level as the second surface 100b of the first substrate 100.

The first impurity region 160 and the floating diffusion region FD may be formed by injecting impurities into the first substrate 100 through the first surface 100a. The impurity injection process may be performed using a second mask (not shown). For example, the impurity injection process may include forming the second mask on the first surface 100a of the first substrate 100 and injecting the impurities into the first substrate 100 through the first surface 100a using the second mask. The impurities may serve as dopants in the first impurity region 160 and the floating diffusion region FD. The first impurity region 160 may include impurities of the first conductivity type (e.g., p-type). The floating diffusion region FD may include impurities of the second conductivity type (e.g., n-type). The device isolation pattern 103 may be adjacent to a side surface of each of the floating diffusion region FD and the first impurity region 160. For example, the first impurity region 160 and the floating diffusion region FD may be sequentially formed through separate processes. For example, the first impurity region 160 and the floating diffusion region FD are not formed at the same time.

Referring to FIG. 10B, the transfer gate TG may be formed on the first substrate 100. For example, the transfer gate TG may include the first portion TGa, which protrudes from the first surface 100a of the first substrate 100, and the second portion TGb, which is extended from the first portion Tga into the first substrate 100 and is buried therein. The transfer gate TG may be formed to be adjacent to a side surface of the floating diffusion region FD. The gate spacer GS may be formed on the transfer gate TG. The gate spacer GS may cover the top and side surfaces of the transfer gate TG.

The first insulating layer 221 may be formed on the first surface 100a of the first substrate 100. The first insulating layer 221 may cover the first surface 100a of the first substrate 100 and the top and side surfaces of the gate spacer GS. The first insulating layer 221 may have a top surface that is located at a level higher than the top surface of the gate spacer GS.

Referring to FIG. 10C, the first auxiliary isolation pattern 170a may be formed to penetrate the first insulating layer 221 and to be extended into the first substrate 100. The first auxiliary isolation pattern 170a may be formed in a self-aligned manner. For example, the first auxiliary isolation pattern 170a may be formed in a self-aligned manner by using the transfer gate TG covered with the gate spacer GS which serves to protect the transfer gate TG when an etching process is performed on the first insulating layer 221 to form the seventh trench TR7. Accordingly, it may be possible to prevent an alignment failure (i.e., misalignment) of the first auxiliary isolation pattern 170a. The formation of the first auxiliary isolation pattern 170a may include etching the first insulating layer 221 and an upper portion of the first substrate 100 to form the seventh trench TR7 and filling the seventh trench TR7 with a silicon-containing insulating material. The first auxiliary isolation pattern 170a may be adjacent to a side surface of the gate spacer GS. The first auxiliary isolation pattern 170a may be formed between the first impurity region 160 and the transfer gate TG.

After the formation of the first auxiliary isolation pattern 170a, a planarization process may be performed on the first insulating layer 221. The planarization process may be performed to expose the top surface of the gate spacer GS.

Thereafter, the process described with reference to FIG. 5A may be performed in substantially the same manner. As a result, the image sensor described with reference to FIGS. 9A and 9B may be fabricated.

As described above, the auxiliary isolation pattern 170 and the device isolation pattern 103 may be formed through separate processes. For example, the auxiliary isolation pattern 170 may be formed after the impurity injection process. In the case where the device isolation pattern is formed in an upper portion of a substrate and an impurity injection process is performed, designing of an image sensor may be restricted by widths of the device isolation pattern and the impurity-injected region. In contrast, according to an embodiment of the inventive concept, after the impurity injection process, the auxiliary isolation pattern of a relatively small width may be formed to replace at least one of the device isolation patterns. Since the impurity injection process may be performed on an upper portion of a substrate before the device isolation pattern is formed, the freedom of designing and fabricating an image sensor may increase, and an integration density of the image sensor may increase.

Figure 11A:
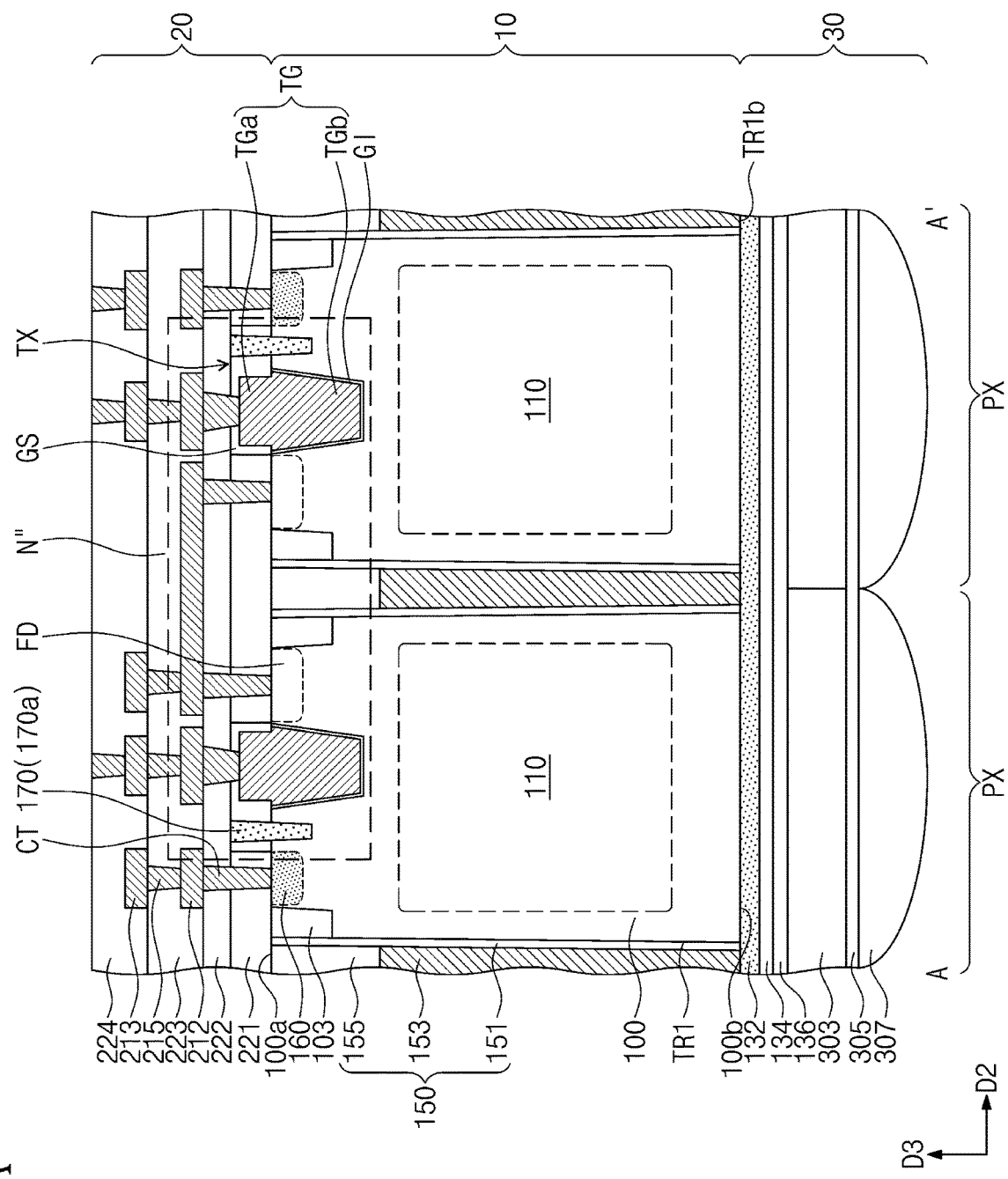
FIG. 11A is a sectional view, which is taken along the line A-A' of FIG. 4 to illustrate an image sensor according to an embodiment of the inventive concept.
Figure 11B:
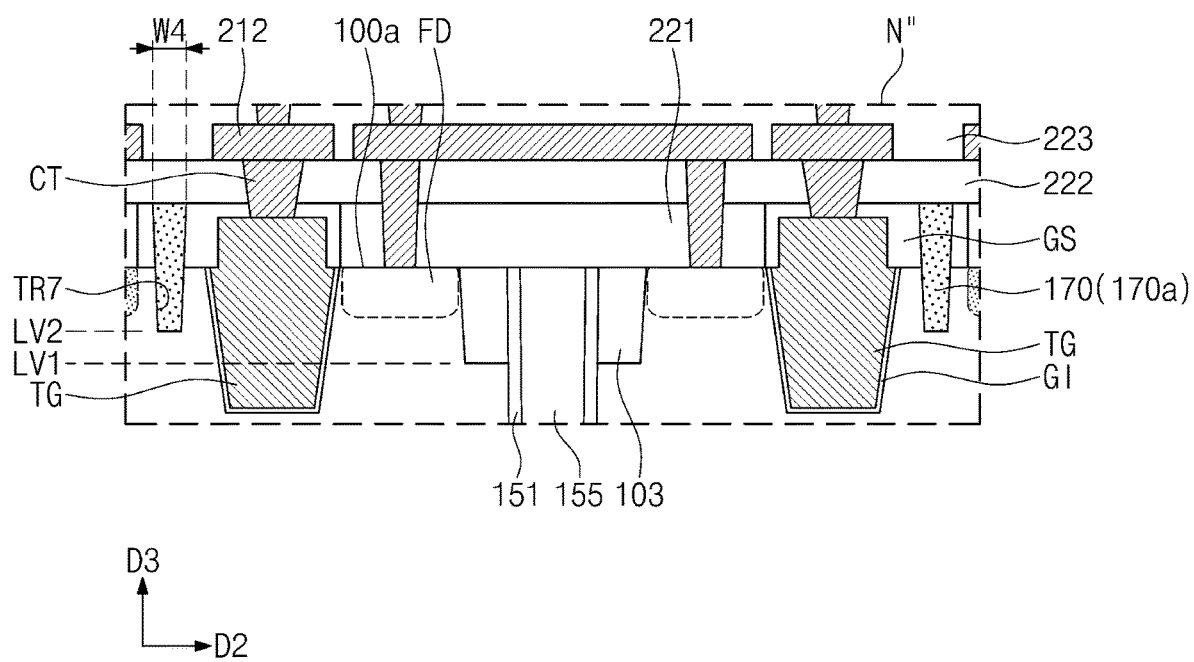
FIG. 11B is an enlarged sectional view illustrating a portion N" of FIG. 11A.

FIG. 11A is a sectional view, which is taken along line A-A' of FIG. 4 to illustrate an image sensor according to an embodiment of the inventive concept. FIG. 11B is an enlarged sectional view illustrating a portion N" of FIG. 11A. For concise description, a previously described element may be identified by the same reference number without repeating an overlapping description thereof. The present embodiment will be described with reference to FIGS. 11A and 11B in conjunction with FIG. 4.

Referring to FIGS. 11A and 11B, the gate spacer GS may be provided on the transfer gate TG. The gate spacer GS may be extended from the transfer gate TG toward the first impurity region 160 in the second direction D2. For example, the gate spacer GS does not vertically overlap the first impurity region 160. As another example, a portion of the gate spacer GS may vertically overlap the first impurity region 160.

The first auxiliary isolation pattern 170a may be provided to penetrate the gate spacer GS and may be extended into the first substrate 100. For example, the first auxiliary isolation pattern 170a may penetrate the gate spacer GS between the first impurity region 160 and the transfer gate TG. The first auxiliary isolation pattern 170a may be provided between the first impurity region 160 and the transfer gate TG. The first auxiliary isolation pattern 170a may be provided in the gate spacer GS. A top surface of the first auxiliary isolation pattern 170a may be substantially coplanar with the top surface of the gate spacer GS. The top surface of the first auxiliary isolation pattern 170a may be substantially coplanar with the top surface of the first insulating layer 221.

The device isolation pattern 103 may have a bottom surface that is located at the first level LV1. The auxiliary isolation pattern 170 may have a bottom surface that is located at the second level LV2. The first level LV1 may be different from the second level LV2. For example, the first level LV1 may be lower than the second level LV2. As another example, the first level LV1 may be higher than the second level LV2.

The smallest width of the device isolation pattern 103, which is provided between the active patterns on the unit pixel regions PX, at the level of the first surface 100a may be a third width W3. The width of the first auxiliary isolation pattern 170a at its top surface level may be a fourth width W4. For example, the third width W3 may be larger than the fourth width W4. The width of the first auxiliary isolation pattern 170a at the level of the first surface 100a may be smaller than the fourth width W4.

Figure 12A:
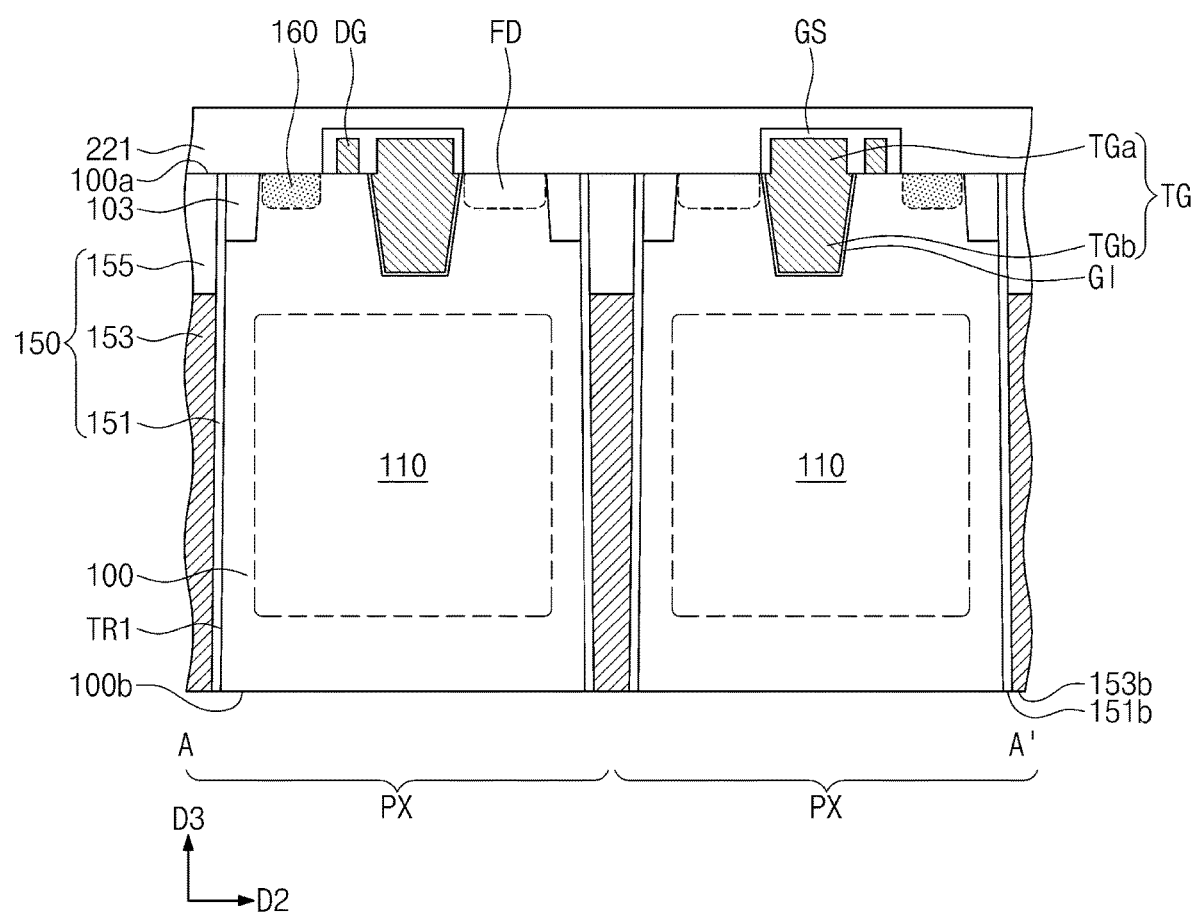
FIGS. 12A and 12B are sectional views, which are taken along the line A-A' of FIG. 4 to illustrate a method of fabricating an image sensor according to an embodiment of the inventive concept.
Figure 12B:
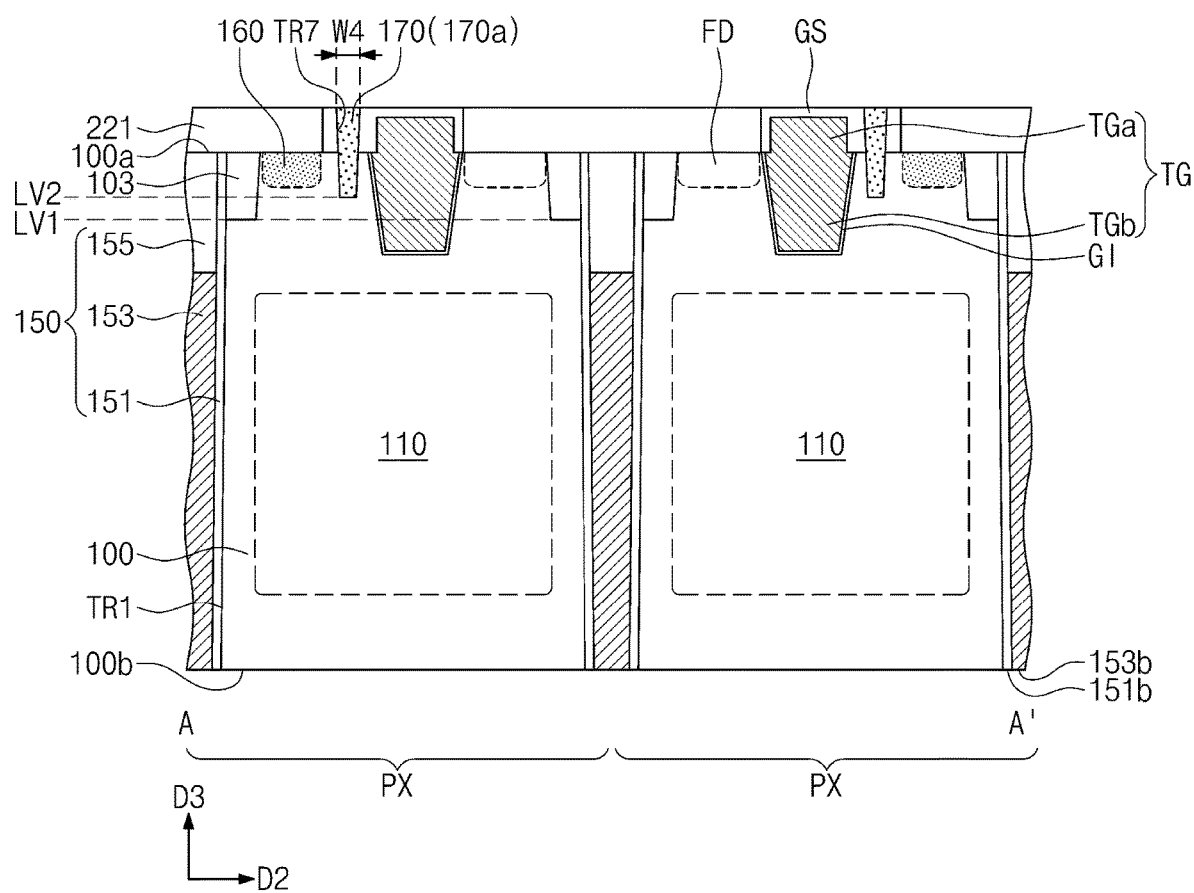

FIGS. 12A and 12B are sectional views, which are taken along the line A-A' of FIG. 4 to illustrate a method of fabricating an image sensor according to an embodiment of the inventive concept. For concise description, a previously described element may be identified by the same reference number without repeating an overlapping description thereof.

Referring to FIG. 12A, after the process described with reference to FIG. 10A, the transfer gate TG may be formed on the first surface 100a of the first substrate 100. For example, the transfer gate TG may include the first portion TGa, which protrudes from the first surface 100a of the first substrate 100, and the second portion TGb, which is extended from the first portion TGa into the first substrate 100 and is buried therein. The transfer gate TG may be formed to be adjacent to a side surface of the floating diffusion region FD.

A dummy gate DG may be formed between the transfer gate TG and the first impurity region 160. The dummy gate DG may be formed on the first surface 100a of the first substrate 100. The dummy gate DG may be formed to have a width that is smaller than a width of the first portion TGa.

The gate spacer GS may be formed on the transfer gate TG and the dummy gate DG. The gate spacer GS may cover top and side surfaces of the transfer gate TG and top and side surfaces of the dummy gate DG.

The first insulating layer 221 may be formed on the first surface 100a of the first substrate 100. The first insulating layer 221 may cover the first surface 100a of the first substrate 100 and top and side surfaces of the gate spacer GS. The first insulating layer 221 may have a top surface that is located at a level higher than the top surface of the gate spacer GS.

Referring to FIG. 12B, the first auxiliary isolation pattern 170a may be formed to penetrate the first insulating layer 221 and the gate spacer GS and to be extended into the first substrate 100. The formation of the first auxiliary isolation pattern 170a may include etching the first insulating layer 221, the dummy gate DG, and an upper portion of the first substrate 100 to form the seventh trench TR7 and filling the seventh trench TR7 with a silicon-containing insulating material. The seventh trench TR7 may be formed by selectively etching the dummy gate DG using etch selectivity of the dummy gate DG with respect to the gate spacer GS. Accordingly, it may be possible to prevent an alignment failure of the first auxiliary isolation pattern 170a and to reduce a width of the first auxiliary isolation pattern 170a. The first auxiliary isolation pattern 170a may be formed in the gate spacer GS. The first auxiliary isolation pattern 170a may be formed between the first impurity region 160 and the transfer gate TG.

After the formation of the first auxiliary isolation pattern 170a, a planarization process may be performed on the first insulating layer 221. The planarization process may be performed to expose the top surface of the gate spacer GS.

Thereafter, the process described with reference to FIG. 5A may be performed in substantially the same manner. As a result, the image sensor described with reference to FIGS. 11A and 11B may be fabricated.

Figure 13A:
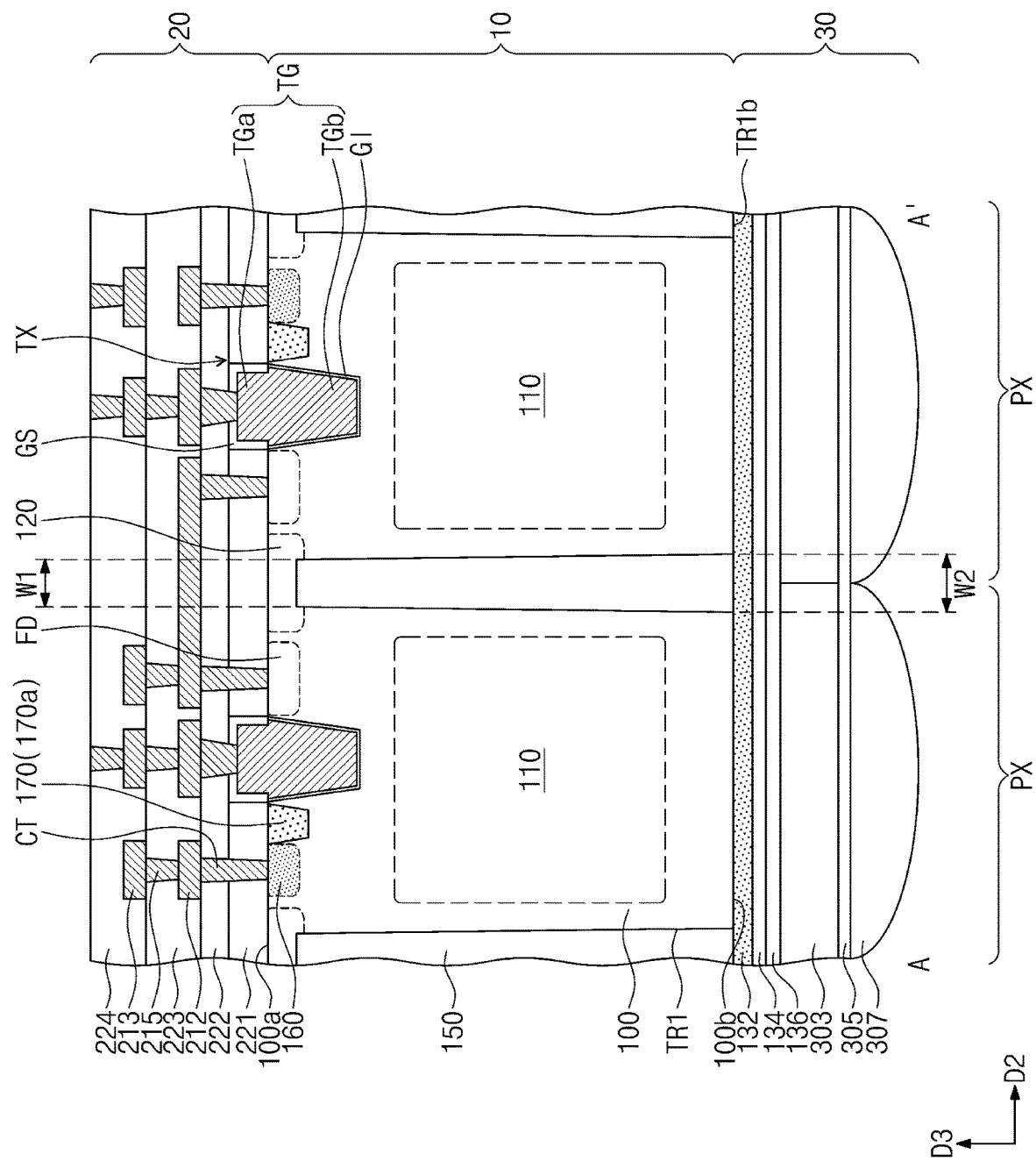
FIGS. 13A to 13C are sectional views illustrating an image sensor according to an embodiment of the inventive concept.
Figure 13B:
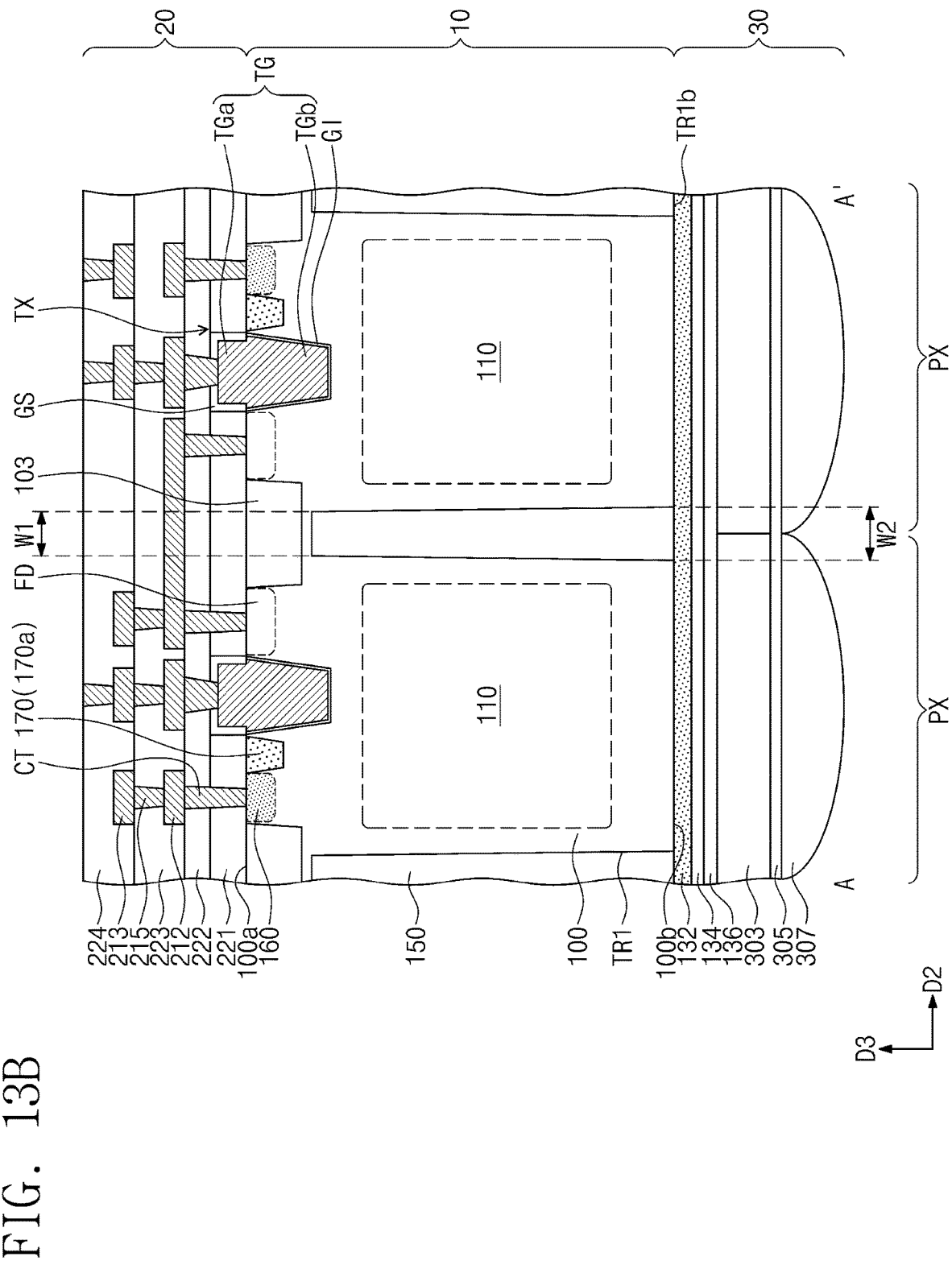
Figure 13C:
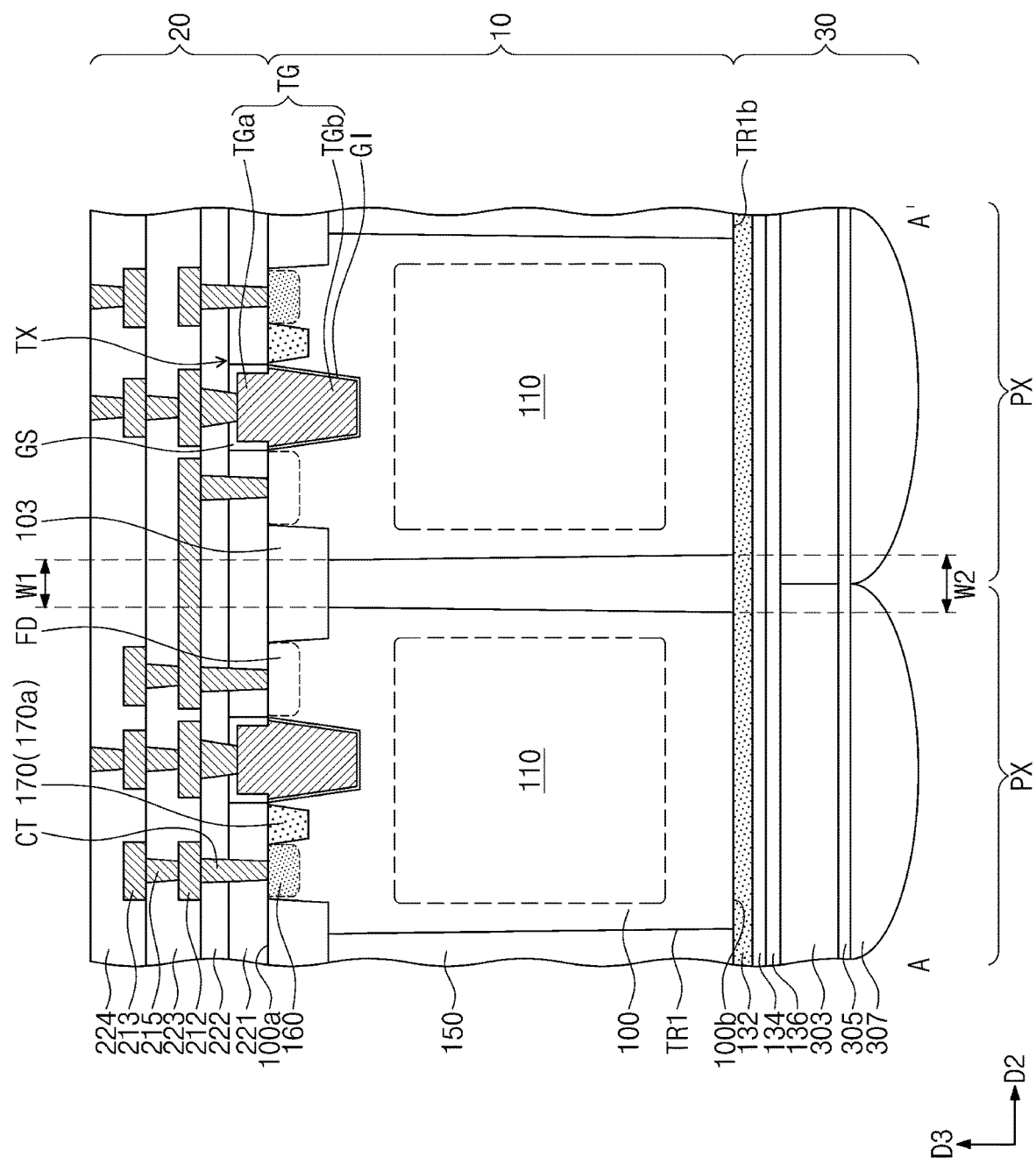

FIGS. 13A to 13C are sectional views illustrating an image sensor according to an embodiment of the inventive concept. For concise description, a previously described element may be identified by the same reference number without repeating an overlapping description thereof.

Referring to FIG. 13A, the pixel isolation pattern 150 may be provided in the first trench TR1. The first trench TR1 may be recessed from the second surface 100b of the first substrate 100 toward the first surface 100a of the first substrate 100. A width W2 of a bottom surface of the pixel isolation pattern 150 may be larger than a width W1 of a top surface of the pixel isolation pattern 150. The bottom surface of the pixel isolation pattern 150 may be substantially coplanar with the second surface 100b. The pixel isolation pattern 150 may penetrate the second surface 100b of the first substrate 100. In an embodiment, the top surface of the pixel isolation pattern 150 may be disposed in the first substrate 100. Thus, the pixel isolation pattern 150 may be vertically spaced apart from the first surface 100a of the first substrate 100. The pixel isolation pattern 150 does not include the second isolation pattern 153, unlike that described with reference to FIG. 5A. The pixel isolation pattern 150 does not include a crystalline semiconductor material (e.g., polycrystalline silicon).

A doped region 120 may be interposed between the first surface 100a of the first substrate 100 and the pixel isolation pattern 150. The doped region 120 may have a first conductivity type (e.g., p-type). The doped region 120 may surround the top surface of the pixel isolation pattern 150.

The image sensor according to the present embodiment may be fabricated by substantially the same method as those in the previously described embodiments. For example, the image sensor may be formed by substantially the same method as that described with reference to FIGS. 8A to 8G, except for formation of the doped region 120. The doped region 120 may be formed by injecting impurities of the first conductivity type into the first substrate 100 through the first surface 100a. The formation of the pixel isolation pattern 150 may be performed after the thinning process described with reference to FIG. 8E. The formation of the pixel isolation pattern 150 may include forming the first trench TR1 in the second surface 100b of the first substrate 100 and filling the first trench TR1 with an insulating material.

Referring to FIG. 13B, the pixel isolation pattern 150 may be provided in the first trench TR1. The first trench TR1 may be recessed from the second surface 100b of the first substrate 100 toward the first surface 100a of the first substrate 100. A width W2 of a bottom surface of the pixel isolation pattern 150 may be larger than a width W1 of a top surface of the pixel isolation pattern 150.

The device isolation pattern 103 may be provided between the first surface 100a of the first substrate 100 and the pixel isolation pattern 150. For example, the device isolation pattern 103 may be provided, instead of the doped region 120 described with reference to FIG. 13A. In an embodiment, the device isolation pattern 103 and the pixel isolation pattern 150 may be vertically spaced apart from each other. For example, a portion of the first substrate 100 may be extended into a region between the device isolation pattern 103 and the pixel isolation pattern 150.

Referring to FIG. 13C, the device isolation pattern 103 may be connected to the pixel isolation pattern 150. The device isolation pattern 103 may be interposed between the first surface 100a of the first substrate 100 and the pixel isolation pattern 150.

Figure 14:
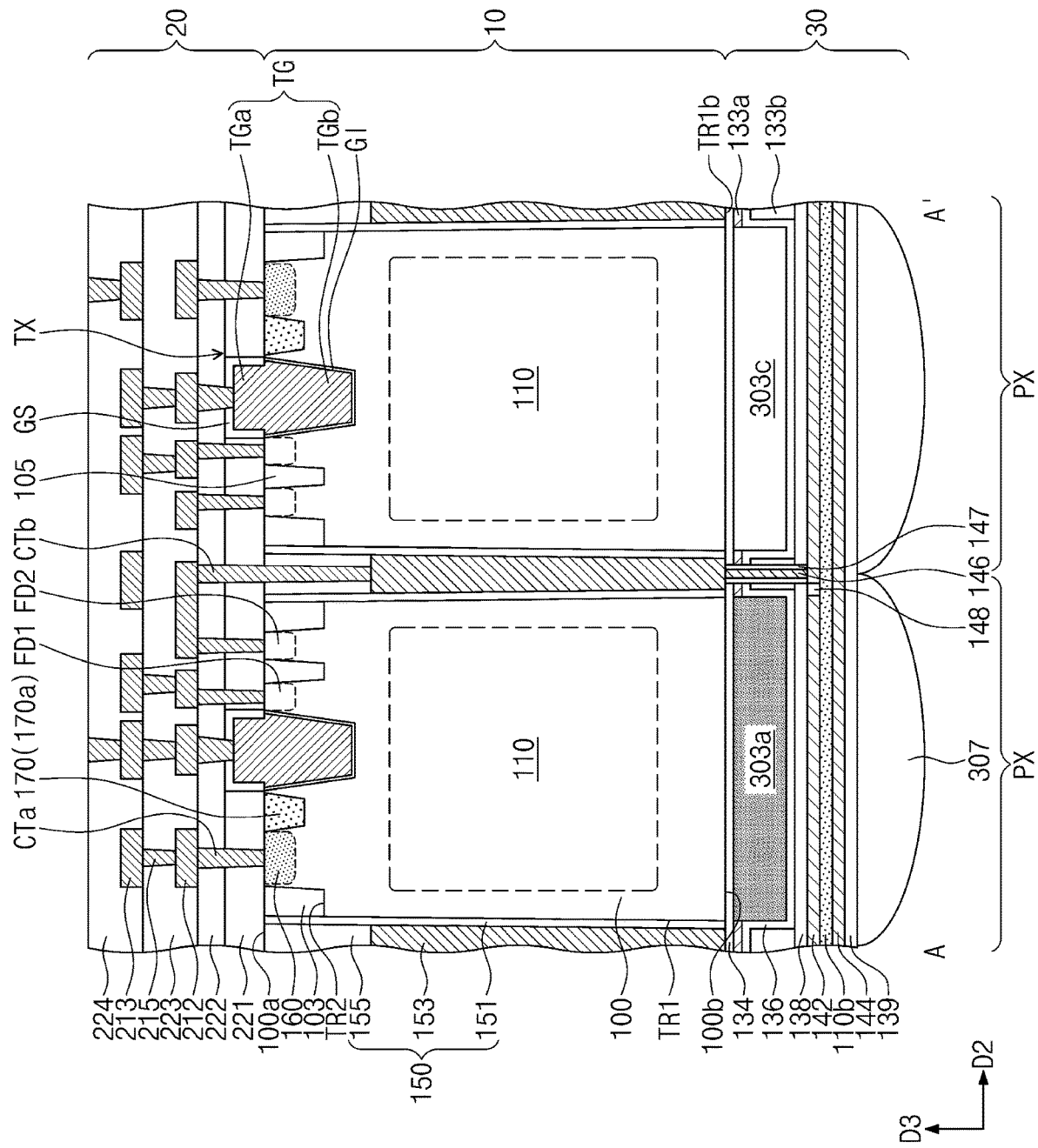
FIG. 14 is a sectional view illustrating an image sensor according to an embodiment of the inventive concept.

FIG. 14 is a sectional view illustrating an image sensor according to an embodiment of the inventive concept. For concise description, a previously described element may be identified by the same reference number without repeating an overlapping description thereof.

Referring to FIG. 14, the transfer gate TG may be provided on the first surface 100a of the first substrate 100. The device isolation pattern 103 (i.e., a first device isolation pattern) and a second device isolation pattern 105 may be provided in an upper portion of the first substrate 100. The first and second device isolation patterns 103 and 105 may be adjacent to the first surface 100a of the first substrate 100. A first floating diffusion region FD1 and a second floating diffusion region FD2 may be provided in an upper portion of the first substrate 100. The first and second floating diffusion regions FD1 and FD2 may be provided in the first active pattern. The second floating diffusion region FD2 may be spaced apart from the first floating diffusion region FD1 by the second device isolation pattern 105.

The first insulating layer 134 may be provided on the second surface 100b of the first substrate 100. Color filters 303a and 303c may be disposed on the first insulating layer 134 and in the unit pixel regions PX, respectively. A light-blocking pattern 133a may be disposed on the first insulating layer 134 and between the color filters 303a and 303c. Side and bottom surfaces of the color filters 303a and 303c and a bottom surface of the light-blocking pattern 133a may be covered with the second insulating layer 136. A space between the color filters 303a and 303c may be filled with a low-refractive pattern 133b.

A third insulating layer 138 may be provided on the second insulating layer 136 and the low-refractive pattern 133b. A pixel electrode 142 may be provided on the third insulating layer 138 and in each of the unit pixel regions PX. An insulating pattern 148 may be interposed between the pixel electrodes 142. In an embodiment, the insulating pattern 148 may include a silicon oxide layer or a silicon nitride layer. A first photoelectric conversion layer 110b may be provided on the pixel electrodes 142. A common electrode 144 may be provided on the first photoelectric conversion layer 110b. A passivation layer 139 may be provided on the common electrode 144. The micro lenses 307 may be provided on the passivation layer 139.

The pixel electrode 142 and the common electrode 144 may be formed of or include at least one of indium tin oxide (ITO), indium zinc oxide (IZO), zinc oxide (ZnO), and/or organic transparent conductive materials. In an embodiment, the first photoelectric conversion layer 110b may be an organic photoelectric conversion layer. The first photoelectric conversion layer 110b may include a p-type organic semiconductor material and an n-type organic semiconductor material, and the p-type and n-type organic semiconductor materials may be formed to constitute a p-n junction. Alternatively, the first photoelectric conversion layer 110b may include quantum dots or a chalcogenide material.

The pixel electrode 142 may be electrically connected to the pixel isolation pattern 150 through a via plug 146. For example, the pixel electrode 142 may be electrically connected to the second isolation pattern 153 of the pixel isolation pattern 150. The via plug 146 may be provided to penetrate the third insulating layer 138, the low-refractive pattern 133b, the first insulating layer 134, the light-blocking pattern 133a, and the first insulating layer 134 to be in contact with the pixel isolation pattern 150. A side surface of the via plug 146 may be covered with a via insulating layer 147. The pixel isolation pattern 150 may be electrically connected to the second floating diffusion region FD2 through a first interconnection line 212 and contacts CTa and CTb. First contacts CTa may be coupled to at least one of the first impurity region 160, the transfer gate TG, and the first and second floating diffusion regions FD1 and FD2. A second contact CTb may be coupled to the second isolation pattern 153. A bottom surface of the second contact CTb may be located at a level lower than bottom surfaces of the first contacts CTa.

Figure 15:
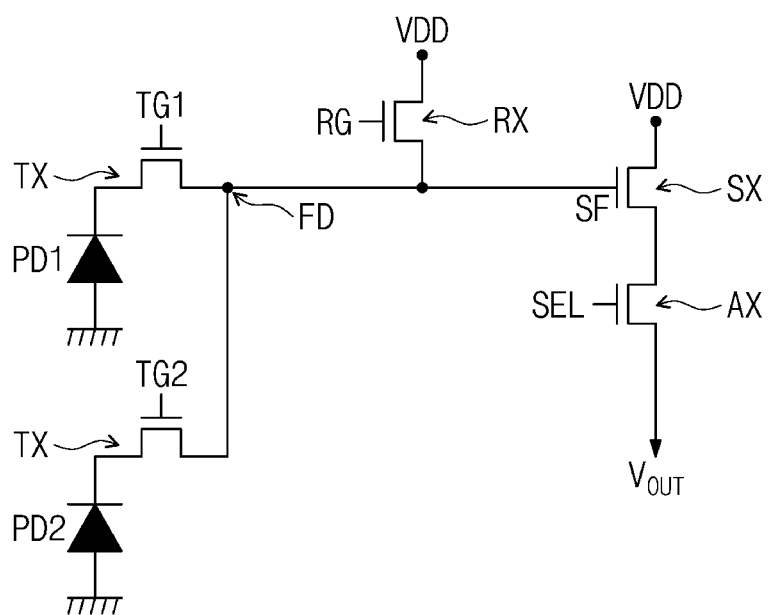
FIG. 15 is a circuit diagram illustrating an image sensor according to an embodiment of the inventive concept.
Figure 16:
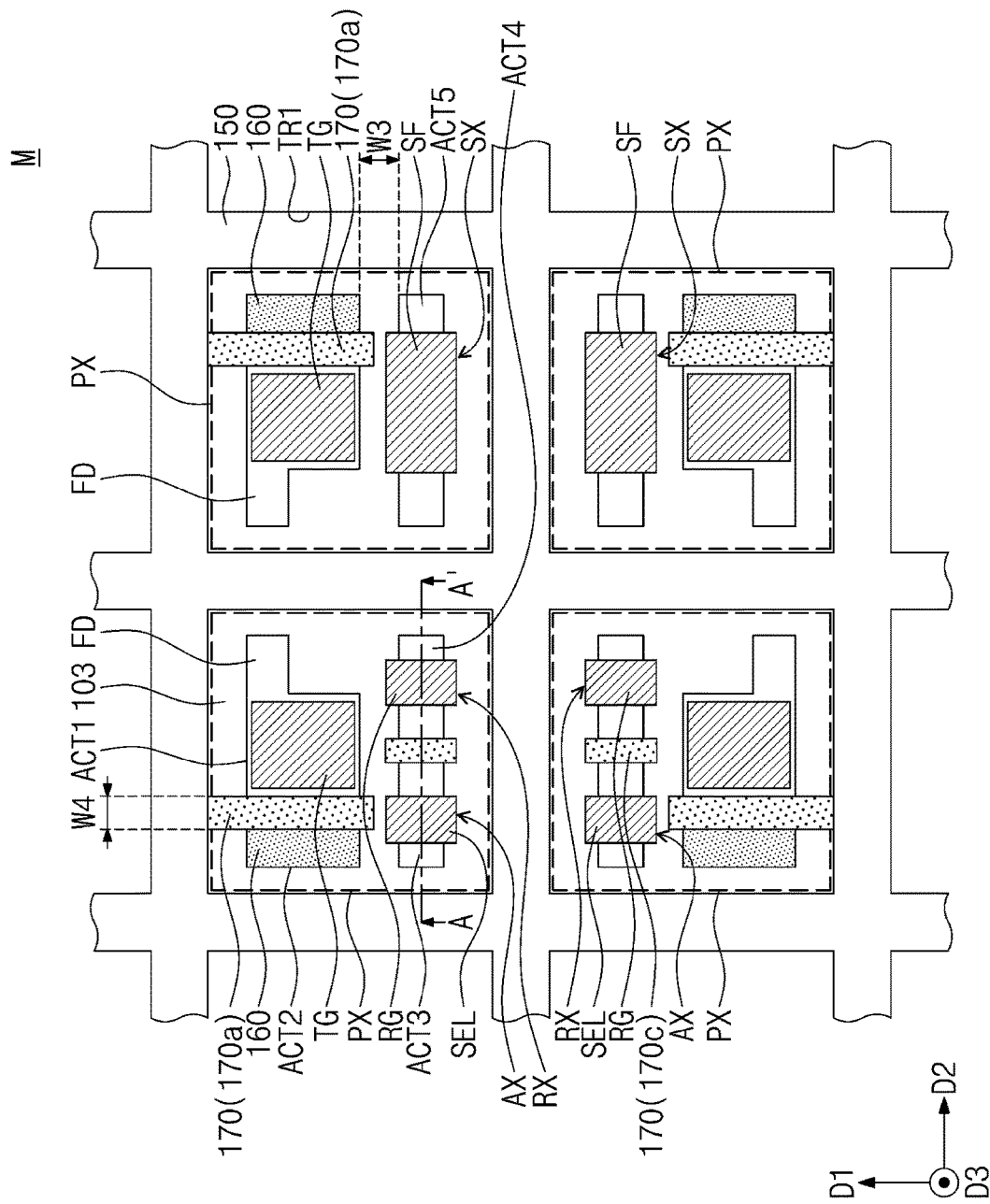
FIG. 16 is an enlarged plan view illustrating a portion (e.g., the portion M of FIG. 2) of an image sensor according to an embodiment of the inventive concept.
Figure 17:
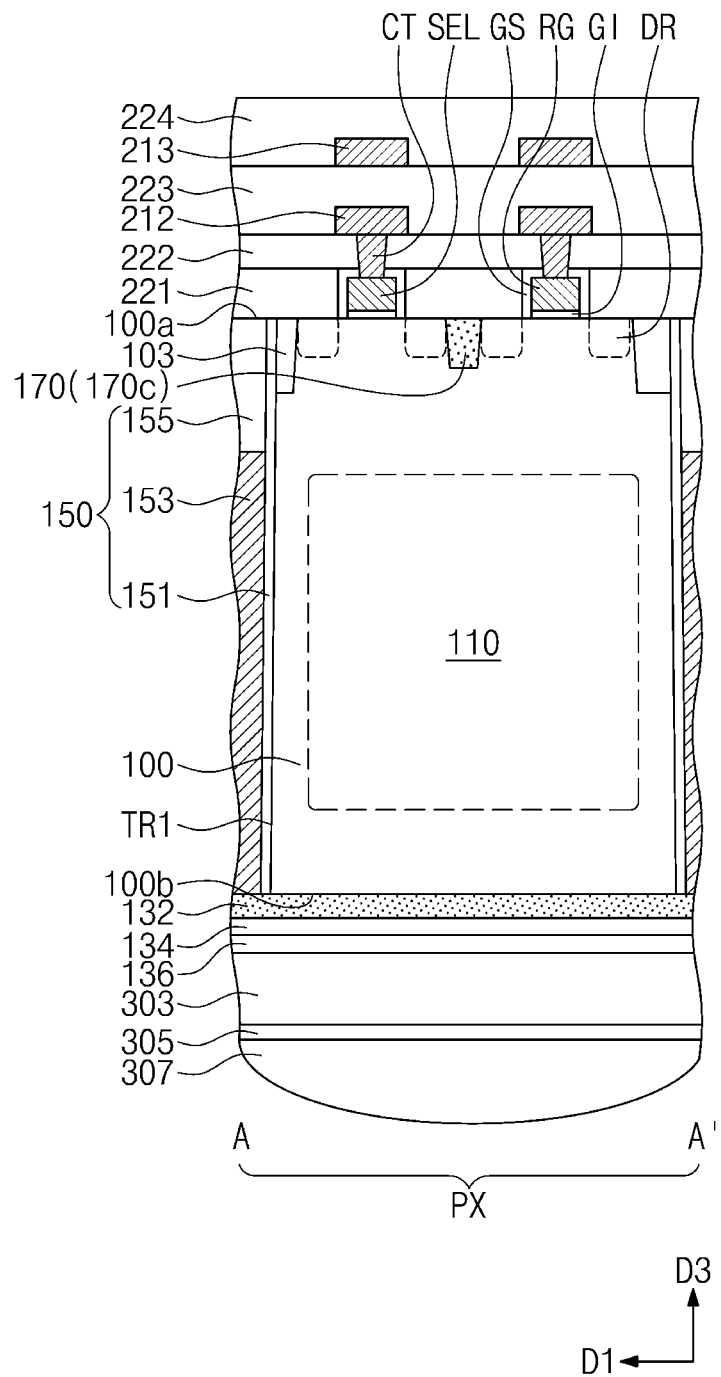
FIG. 17 is a sectional view, which is taken along a line A-A' of FIG. 16 to illustrate an image sensor according to an embodiment of the inventive concept.

FIG. 15 is a circuit diagram illustrating an image sensor according to an embodiment of the inventive concept. FIG. 16 is an enlarged plan view illustrating a portion (e.g., the portion M of FIG. 2) of an image sensor according to an embodiment of the inventive concept. FIG. 17 is a sectional view, which is taken along a line A-A' of FIG. 16 to illustrate an image sensor according to an embodiment of the inventive concept. For concise description, a previously described element may be identified by the same reference number without repeating an overlapping description thereof.

Referring to FIGS. 15 and 16, the dual conversion transistor DCX may be omitted, unlike the afore-described embodiments. For example, the floating diffusion region FD may be used as the source of the reset transistor RX.

Referring to FIGS. 15 to 17, each of the unit pixel regions PX may include the auxiliary isolation patterns 170. The auxiliary isolation patterns 170 may include the first auxiliary isolation pattern 170a and a third auxiliary isolation pattern 170c. Each of the unit pixel regions PX may include the first active pattern ACT1 and the second active pattern ACT2, which are defined by the device isolation pattern 103 and the first auxiliary isolation pattern 170a. Each of the unit pixel regions PX may include the third active pattern ACT3 and the fourth active pattern ACT4, or a fifth active pattern ACT5. The third active pattern ACT3 and the fourth active pattern ACT4 may be defined by the device isolation pattern 103 and the third auxiliary isolation pattern 170c. The fifth active pattern ACT5 may be defined by the device isolation pattern 103. Although not shown, the second auxiliary isolation pattern 170b described with reference to FIG. 4 may be additionally provided. When viewed in a plan view, the second auxiliary isolation pattern 170b may be provided between the second active pattern ACT2 and the third active pattern ACT3 and between the second active pattern ACT2 and the fifth active pattern ACT5.

The transfer transistor TX, the source follower transistor SX, the reset transistor RX, and the selection transistor AX described with reference to FIG. 15 may be provided on the first surface 100a of the first substrate 100. The transfer transistor TX may be provided on the first active pattern ACT1 of each of the unit pixel regions PX.

The selection transistor AX may be provided on the third active patterns ACT3 of the unit pixel regions PX. The reset transistor RX may be provided on the fourth active patterns ACT4 of the unit pixel regions PX. The selection transistor AX may include the selection gate SEL on the third active pattern ACT3, and the reset transistor RX may include the reset gate RG on the fourth active pattern ACT4. The source follower transistor SX may be provided on the fifth active patterns ACT5 of the unit pixel regions PX. The source follower transistor SX may include the source follower gate SF on the fifth active pattern ACT5.

Referring to FIG. 17, the gate spacer GS may be provided on the top and side surfaces of each of the selection gate SEL and the reset gate RG. The second impurity regions DR may be provided at both sides of each of the selection gate SEL and the reset gate RG. The second impurity region DR may have a second conductivity type (e.g., n-type).

When viewed in a plan view, the third auxiliary isolation pattern 170c may be provided between the selection gate SEL and the reset gate RG. The third auxiliary isolation pattern 170c between the selection gate SEL and the reset gate RG may define the third and fourth active patterns ACT3 and ACT4. The third auxiliary isolation pattern 170c may be extended in the first direction D1. The third and fourth active patterns ACT3 and ACT4 may be spaced apart from each other by the third auxiliary isolation pattern 170c. The third auxiliary isolation pattern 170c may include a side portion adjacent to the second impurity region DR. The third auxiliary isolation pattern 170c may have a bottom surface that is located at a level different from the bottom surface of the device isolation pattern 103. For example, the bottom surface of the third auxiliary isolation pattern 170c may be located at a level higher than the bottom surface of the device isolation pattern 103.

In an embodiment, although not shown, the third auxiliary isolation pattern 170c may be adjacent to a side surface of the gate spacer GS, as described with reference to FIGS. 9A and 9B. The third auxiliary isolation pattern 170c may be provided to penetrate the first insulating layer 221 and may be extended into the first substrate 100. In an embodiment, although not shown, the third auxiliary isolation pattern 170c may be provided to penetrate a dummy gate spacer (not shown) between the selection gate SEL and the reset gate RG, as described with reference to FIGS. 11A and 11B. The dummy gate spacer may be additionally provided on the first surface 100a and between the selection gate SEL and the reset gate RG. The third auxiliary isolation pattern 170c may be provided to penetrate the dummy gate spacer between the selection gate SEL and the reset gate RG and may be extended into the first substrate 100. The dummy gate spacer may have a top surface that is substantially coplanar with a top surface of the third auxiliary isolation pattern 170c. The top surface of the third auxiliary isolation pattern 170c may be substantially coplanar with the top surface of the first insulating layer 221.

According to an embodiment of the inventive concept, an auxiliary isolation pattern, which is formed by a process different from that for a device isolation pattern, may be provided between a ground region and a gate electrode. Accordingly, the freedom of designing and fabricating an image sensor may increase.

While example embodiments of the inventive concept have been particularly shown and described, it will be understood by one of ordinary skill in the art that variations in form and detail may be made therein without departing from the spirit and scope of the attached claims.

What is claimed is:

1. An image sensor, comprising:
a substrate having a first surface and a second surface, which are opposite to each other, the substrate comprising a unit pixel region, the unit pixel region including a device isolation pattern adjacent to the first surface and a photoelectric conversion region adjacent to the second surface;
a pixel isolation pattern provided in the substrate to define the unit pixel region;
an impurity region provided in the unit pixel region and being adjacent to a side surface of the device isolation pattern;
a gate electrode provided on the first surface; and
an auxiliary isolation pattern provided between a first side surface of the gate electrode and the impurity region, when the image sensor is viewed in a plan view,
wherein a bottom surface of the auxiliary isolation pattern is located at a level different from a bottom surface of the device isolation pattern.

2. The image sensor of claim 1,
wherein the auxiliary isolation pattern has a density higher than the device isolation pattern.

3. The image sensor of claim 1, further comprising:
a floating diffusion region, which is adjacent to a second side surface of the gate electrode and is provided in the unit pixel region,
wherein the second side surface of the gate electrode is opposite to the first side surface of the gate electrode, and
wherein when the image sensor is viewed in the plan view, the impurity region and the floating diffusion region are spaced apart from each other in a first direction, and the auxiliary isolation pattern is provided between the impurity region and the floating diffusion region and is extended in a second direction crossing the first direction.

4. The image sensor of claim 3,
wherein the unit pixel region comprises a first active pattern and a second active pattern, which are provided in an upper portion of the substrate and are spaced apart from each other in the first direction, and
wherein the smallest width, at a level of the first surface of the substrate, of the device isolation pattern between the first and second active patterns is larger than a width, in the first direction and at the level of the first surface, of the auxiliary isolation pattern.

5. The image sensor of claim 4,
wherein the width, in the first direction and at the level of the first surface, of the auxiliary isolation pattern has a value from 120 Å to 600 Å.

6. The image sensor of claim 1, further comprising:
an insulating layer provided on the first surface of the substrate; and
a gate spacer provided on the gate electrode,
wherein the gate electrode comprises:
a first portion buried in the insulating layer; and
a second portion buried in the substrate, and
wherein the gate spacer is provided on top and side surfaces of the first portion.

7. The image sensor of claim 6,
wherein the auxiliary isolation pattern penetrates the insulating layer and is adjacent to the gate spacer.

8. The image sensor of claim 6,
wherein the auxiliary isolation pattern penetrates the gate spacer.

9. The image sensor of claim 6,
wherein a top surface of the auxiliary isolation pattern is substantially coplanar with a top surface of the gate spacer.

10. The image sensor of claim 1,
wherein a bottom surface of the pixel isolation pattern is substantially coplanar with the second surface, and
wherein a width of a top surface of the pixel isolation pattern is smaller than a width of the bottom surface of the pixel isolation pattern.

11. An image sensor, comprising:
a substrate having a first surface and a second surface, which are opposite to each other, and comprising a unit pixel region including a floating diffusion region adjacent to the first surface, and a photoelectric conversion region adjacent to the second surface;
a device isolation pattern provided in an upper portion of the substrate and extending from the first surface toward the second surface;
a pixel isolation pattern penetrating the substrate and the device isolation pattern, and defining the unit pixel region;
an impurity region provided in the unit pixel region and adjacent to a side surface of the device isolation pattern; and a first auxiliary isolation pattern provided between the impurity region and the floating diffusion region and extended in a first direction, when the image sensor is viewed in a plan view, wherein the unit pixel region comprises a first active pattern and a second active pattern, which are provided in the upper portion of the substrate and are spaced apart from each other in the first direction, and wherein the smallest width of the device isolation pattern between the first and second active patterns at a level of the first surface is larger than a width of the first auxiliary isolation pattern at the level of the first surface.

12. The image sensor of claim 11, wherein a density of the first auxiliary isolation pattern is higher than a density of the device isolation pattern, and wherein a bottom surface of the first auxiliary isolation pattern is located at a level different from the bottom surface of the device isolation pattern.

13. The image sensor of claim 11, further comprising:

an insulating layer provided on the first surface; and a first gate electrode penetrating the insulating layer, wherein the first auxiliary isolation pattern is provided at a region adjacent to a side surface of the first gate electrode.

14. The image sensor of claim 13, further comprising:

a second gate electrode and a third gate electrode, which, when the image sensor is viewed in the plan view, are spaced apart from the first gate electrode in the first direction; and a second auxiliary isolation pattern provided between the second and third gate electrodes, wherein a bottom surface of the second auxiliary isolation pattern is located at a level different from the bottom surface of the device isolation pattern.

15. The image sensor of claim 13, further comprising:

a gate spacer provided on top and side surfaces of the first gate electrode, wherein the first auxiliary isolation pattern is adjacent to the gate spacer.

16. An image sensor, comprising:

a substrate having a first surface and a second surface, which are opposite to each other, the substrate comprising a pixel array region, an optical black region, and a pad region, the pixel array region comprising a plurality of unit pixel regions;

a pixel isolation pattern provided in the substrate to define the plurality of unit pixel regions, the pixel isolation pattern comprising an isolation filler pattern and an isolation liner interposed between the isolation filler pattern and the substrate;

a photoelectric conversion region provided in each of the plurality of unit pixel regions and adjacent to the second surface;

an impurity region and a floating diffusion region provided in each of the plurality of unit pixel regions and adjacent to the first surface;

a device isolation pattern provided on a side surface of the impurity region and a side surface of the floating diffusion region;

a gate electrode on the first surface of the substrate;

a gate dielectric layer interposed between the gate electrode and the substrate;

a gate spacer provided on top and side surfaces of the gate electrode;

an interconnection layer provided on the first surface of the substrate, the interconnection layer comprising an insulating layer and a plurality of interconnection lines in the insulating layer;

an auxiliary isolation pattern provided in the substrate and between the gate electrode and the impurity region and extended in a first direction, when the image sensor is viewed in a plan view;

an anti-reflection layer provided on the second surface of the substrate;

a back-side insulating layer on a bottom surface of the anti-reflection layer;

a color filter on a bottom surface of the back-side insulating layer; and a micro lens on a bottom surface of the color filter, wherein a bottom surface of the auxiliary isolation pattern is located at a level different from a bottom surface of the device isolation pattern.

17. The image sensor of claim 16, wherein the auxiliary isolation pattern is adjacent to the gate spacer, and wherein a top surface of the auxiliary isolation pattern is substantially coplanar with a top surface of the gate spacer.

18. The image sensor of claim 16, wherein the auxiliary isolation pattern penetrates the gate spacer, and wherein a top surface of the auxiliary isolation pattern is substantially coplanar with a top surface of the gate spacer.

19. The image sensor of claim 16, wherein each of the plurality of unit pixel regions comprises a first active pattern and a second active pattern, which are provided in an upper portion of the substrate and are spaced apart from each other in the first direction, and wherein the smallest width, at a level of the first surface of the substrate, of the device isolation pattern between the first and second active patterns is larger than a width, at the level of the first surface of the substrate, of the auxiliary isolation pattern.

20. The image sensor of claim 19, wherein the width of the auxiliary isolation pattern at the level of the first surface has a value from 120 Å to 600 Å.

* * * * *